United States Patent
Nagase

(10) Patent No.: US 7,115,352 B2
(45) Date of Patent: *Oct. 3, 2006

(54) METHOD FOR FORMING IMAGES

(75) Inventor: Hiroyuki Nagase, Haibara-gun (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/973,918

(22) Filed: Oct. 27, 2004

(65) Prior Publication Data
US 2005/0112496 A1    May 26, 2005

(30) Foreign Application Priority Data
Oct. 30, 2003  (JP) ............... 2003-370768
Oct. 30, 2003  (JP) ............... 2003-370769

(51) Int. Cl.
G03F 7/30  (2006.01)
G03F 7/32  (2006.01)

(52) U.S. Cl. ............... 430/302; 430/325; 430/331
(58) Field of Classification Search .......... 430/331, 430/302, 325
See application file for complete search history.

(56) References Cited

U.S. PATENT DOCUMENTS
2002/0081527 A1* 6/2002 Kondo .............. 430/302
2003/0082478 A1* 5/2003 Itakura et al. ......... 430/270.1

FOREIGN PATENT DOCUMENTS

| EP | 503602 | * | 9/1992 |
| EP | 854388 | * | 7/1998 |
| EP | 1 035 435 A2 | | 9/2000 |
| EP | 1 110 747 A1 | | 6/2001 |
| EP | 1 195 646 A1 | | 4/2002 |
| EP | 1 241 002 A2 | | 9/2002 |
| EP | 1 260 867 A1 | | 11/2002 |
| EP | 1 262 829 A1 | | 12/2002 |
| EP | 1 334 824 A2 | | 8/2003 |
| EP | 1 502 941 A2 | | 2/2005 |
| EP | 1 503 247 A2 | | 2/2005 |
| JP | 05-88377 A | | 4/1993 |
| JP | 08-108621 A | | 4/1996 |
| JP | 10-239858 | | 9/1998 |
| JP | 11-65126 | | 3/1999 |
| JP | 2001-117240 | | 4/2001 |
| JP | 2002-202616 | | 7/2002 |
| JP | 2003-15318 | | 1/2003 |
| JP | 2004-331880 | | 11/2004 |

OTHER PUBLICATIONS

European Patent Office Search Report.

* cited by examiner

Primary Examiner—Richard L. Schilling
(74) Attorney, Agent, or Firm—Buchanan Ingersol & Rooney PC

(57) ABSTRACT

The present invention relates to a method for forming images which comprises imagewise exposing a photopolymerizable image-forming material comprising a substrate provided thereon with an image-recording layer which comprises a specific photopolymerization initiator system, a polymerizable compound carrying at least one ethylenically unsaturated group and a binder polymer and then developing the imagewise exposed material with a developer containing at least one carbonate and at least one hydrogen carbonate and a specific surfactant in an amount ranging from 1.0 to 10% by weight, and having a specific pH and a specific electrical conductivity. The image-forming method permits the achievement of a sufficient developing ability even at a relatively low pH at which the image-forming material is not damaged so much and the preparation of a printing plate having good printing durability.

10 Claims, 1 Drawing Sheet

METHOD FOR FORMING IMAGES

BACKGROUND OF THE INVENTION

The present invention relates to a method for forming images useful for a negative working image-forming material which can directly be formed into a printing plate by scanning a visible laser beam based on digital signals outputted from, for instance, a computer or which can be subjected to the so-called direct plate-making operation.

As a material for preparing lithographic printing plates, there has conventionally and widely been used a PS plate having such a structure that a lipophilic light-sensitive resin layer is formed on a hydrophilic substrate and a desired printing plate has currently been prepared from such a PS plate by a plate-making method which comprises the steps of subjecting the PS plate to a mask-exposure through a lith film and then removing the non-image area of the light sensitive layer on the exposed PS plate through dissolution.

Recently, there have widely been used digitization techniques in which image information is electronically treated, accumulated and outputted by the action of a computer and a variety of corresponding new image-outputting systems have been put to practical use. Consequently, it has been an important technical subject to develop a CTP technique for directly preparing a printing plate by scanning light rays having highly directional properties such as a laser beam in accordance with the digitized image information without using any lith film and to likewise develop an original plate for preparing a printing plate (printing plate precursor or PS plate for preparing a printing plate) suitably used for the CTP technique.

As such light sources, there have been adopted an Ar laser (488 nm), an FD-YAG laser (532 nm) and an InGaN type semiconductor laser (violet laser; 350 to 450 nm) and there has already been developed and put to practical use an original plate for preparing a lithographic printing plate, which comprises a highly sensitive photopolymerizable light-sensitive layer quite susceptible to light rays from such a light source and capable of ensuring a considerable productivity.

Most of the sensitivity-improving techniques relate to photopolymerization initiator systems and examples of such initiator systems highly sensitive to, for instance, Ar lasers and FD-YAG lasers include combinations of titanocene with coumarin dyes (Patent Article 1: Japanese Un-Examined Patent Publication Hei 9-268185; Patent Article 2: Japanese Un-Examined Patent Publication Hei 6-192309; Patent Article 3: Japanese Un-Examined Patent Publication Hei 10-204085;), combinations of styryl dyes with titanocene (Patent Article 4: Japanese Un-Examined Patent Publication Hei 9-80750) and combinations of dyes having acidic 5-membered heterocyclic nuclei with titanocene (Patent Article 5: Japanese Un-Examined Patent Publication Hei 10-101719).

In addition, as photopolymerization initiator systems highly sensitive to light rays emitted from violet lasers, there have been known, for instance, combinations of naphthofuranone type dyes with titanocene (Patent Article 6: Japanese Un-Examined Patent Publication Hei 2000-206690) and combinations of carbazolyl-styryl type dyes with titanocene (Patent Article 7: Japanese Un-Examined Patent Publication Hei 2001-42524).

On the other hand, the PS plate should have a high solubility difference (discrimination) between the exposed and un-exposed areas on the light-sensitive layer thereof as a developing characteristic property in order to provide a lithographic printing plate stably showing the desired functions thereof. It has been known that this problem may be solved to some extent by the addition of a specific surfactant to a developer (Patent Article 8: Japanese Un-Examined Patent Publication Hei 2003-43703), but it would further be important to reduce any damage of image areas and to steadily maintain the stable activity of a developer used, for the further improvement of the quality of the resulting printing plate.

In this respect, there has been reported the use of a strongly alkaline aqueous solution having a pH value of higher than 12.5 and comprising, for instance, potassium silicate for the development of a negative-working image-forming material which makes use of a photopolymerizable composition (Patent Article 9: Japanese Un-Examined Patent Publication Hei 8-108621), but the use of a developer having such a high pH value suffers from problems such that the developer may considerably damage image areas and the resulting printing plate has insufficient printing durability. Moreover, if such a developing treatment is continued over a long period of time, the developer may undergo a change in its ability of absorbing carbon dioxide due to environmental changes such as a change in the environmental carbon dioxide concentration and the developer correspondingly causes a change in the activity thereof. As a result, various problems arise such that the quality of the plate-making material is quite susceptible to such changes and that components of the plate-making material are accumulated in a developing tank and that the accumulation thereof leads to, for instance, the clogging of piping.

Over against it, there has been proposed a method for developing a layer of a light-sensitive resin composition formed on the surface of a glass surface with, for instance, a mixed aqueous solution containing sodium carbonate and sodium hydrogen carbonate, having a pH value of about 10 in order to inhibit any reduction of the developing ability of the developer with the elapse of time and due to the repeated use of the same (Patent Article 10: Japanese Un-Examined Patent Publication Hei 5-88377; Patent Article 11: Japanese Un-Examined Patent Publication Hei 11-65126).

When the inventors of this invention applied these developers to an original plate for preparing a lithographic printing plate which comprises an aluminum substrate provided thereon with a light-sensitive layer containing a photopolymerizable light-sensitive resin composition, however, it was found that the developers did not have any satisfactory ability to develop non-image areas of such a light-sensitive layer. Moreover, there has also been reported an alkaline developer to which an alkyl phenolic surfactant is added for the solution of a problem concerning the ability of developing a photoresist comprising a pigment dispersed therein (Patent Article 12: Japanese Un-Examined Patent Publication Hei 10-239858), but there has not yet been developed any developer which can satisfy the both requirements for the developing ability and the ability to produce a printing plate having sufficient durability.

SUMMARY OF THE INVENTION

Accordingly it is an object of the present invention to provide a method for forming images which permits the formation of images excellent in the printing durability and resistance to contamination, which hardly causes any reduction, with time, of the developing ability originated from the characteristics of the developer used, which can considerably reduce the amount of scum generated and accumulated in a developing bath during the developing treatment and which can stably conduct the plate-making process over a long period of time.

The inventors of this invention have found that a photopolymerizable image-forming material comprising an image-recording layer which comprises a photo-polymerization initiator system sensitive to light rays whose wavelength falls within the visible to ultraviolet ranges, a polymerizable compound carrying at least one ethylenically unsaturated group and a binder polymer can be imagewise exposed to light and then developed with a carbonate-containing developer which contains a specific nonionic surfactant and has a pH value ranging from 8.5 to 11.5 and whose electrical conductivity falls within a predetermined range to thus improve the ability of developing non-image areas and to thus ensure the achievement of satisfactory developing ability and the formation of a printing plate having good durability and resistance to contamination and as a result, the inventors have accomplished the foregoing object and thus have completed the present invention.

According to the present invention, there is thus provided a method for forming images, which comprises the steps of imagewise exposing a photopolymerizable image-forming material comprising a substrate provided thereon with an image-recording layer which comprises a photopolymerization initiator system sensitive to light rays whose wavelength falls within the visible to ultraviolet ranges, a polymerizable compound carrying at least one ethylenically unsaturated group and a binder polymer and then developing the imagewise exposed image-forming material with a developer containing at least one carbonate and at least one hydrogen carbonate, containing at least one surfactant selected from the group consisting of anionic surfactants and nonionic aromatic ether type surfactants represented by the following general formula (1) in an amount ranging from 1.0 to 10% by weight on the basis of the total weight of the developer, and having a pH value ranging from 8.5 to 11.5 and an electrical conductivity x falling within a predetermined range: $30 < x < 100$ mS/cm:

$$X—Y—O-(A)_n-(B)_m—H \quad (1)$$

wherein, X represents a substituted or unsubstituted aromatic group, Y represents a single bond or an alkylene group having 1 to 10 carbon atoms, A and B may be the same or different from one another and represent either —CH$_2$CH$_2$O— or —CH$_2$CH(CH$_3$)O—, and each of n and m represents 0 or an integer ranging from 1 to 100, provided that n and m do not simultaneously represent 0 and that if either n or m represent 0, n and m are not 1.

It has been found that the use of a developer containing a compound represented by the foregoing formula in the development of an imagewise exposed photo-polymerizable image-forming material would permit the achievement of an excellent developing ability, the improvement of the printing durability of the resulting printing plate due to the reduction of a rate of damaged images and the considerable improvement of the resolution even at a relatively low pH condition wherein the developer or development is less susceptible to carbon dioxide. Moreover, the foregoing compound likewise serves as an agent for improving the ability to disperse the insoluble matter derived from the image-recording layer and it has therefore been found that the use of such a developer would permit the considerable reduction in the amount of scum generated and accumulated in the developing bath during the developing process over a long period of time.

The image-forming method according to the present invention permits the achievement of a sufficient developing ability even at a low pH region in which the image-forming material is not damaged too much and therefore, it permits the simultaneous achievement of the printing durability and the developing ability. Moreover, in the image-forming method, the developing activity of the developer used is hardly reduced even under the influence of carbon dioxide and the method never suffers from a problem originated from the generation of scum.

BEST MODE FOR CARRYING OUT THE INVENTION

Figure 1:
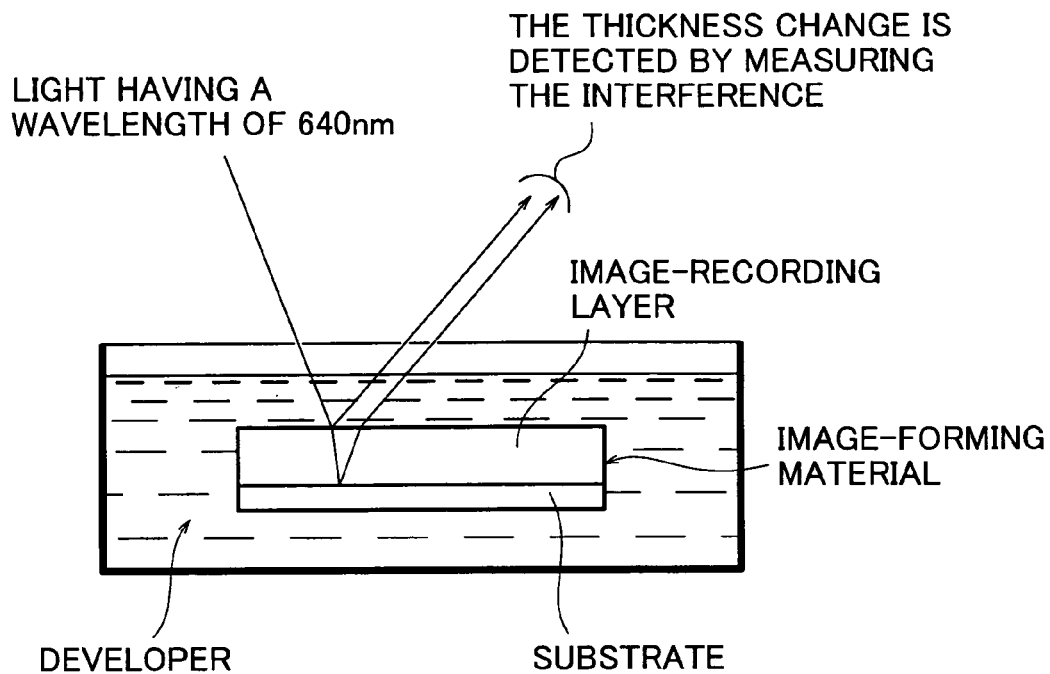
FIG. 1 is a schematic block diagram illustrating an example of a DRM interference fringe-measuring device for the determination of the dissolution behavior of an image-recording layer.

The image-forming method of the present invention will be described below in more detail. The developer used in the image-forming method of the invention will first be explained below.

[Developer]

The developer used in the method of the present invention contains at least one carbonate and at least one hydrogen carbonate, contains at least one anionic surfactant or at least one nonionic, aromatic ether type surfactant having a specific structure in an amount ranging from 1.0 to 10% by weight on the basis of the total weight of the developer, and has a pH value ranging from 8.5 to 11.5 and an electrical conductivity x falling within a predetermined range: $30 < x < 100$ mS/cm.

(Nonionic Aromatic Ether Type Surfactant)

The nonionic, aromatic ether type surfactant included in the developer usable in the method of the invention is one represented by the following general formula (1):

$$X—Y—O-(A)_n-(B)_m—H \quad (1)$$

wherein, X represents a substituted or unsubstituted aromatic group, Y represents a single bond or an alkylene group having 1 to 10 carbon atoms, A and B may be the same or different from one another and represent either —CH$_2$CH$_2$O— or —CH$_2$CH(CH$_3$)O—, and each of n and m represents 0 or an integer ranging from 1 to 100, provided that n and m do not simultaneously represent 0 and that if either n or m represents 0, n and m are not 1.

Examples of the compounds represented by the foregoing formula are those represented by Formula (1) wherein the aromatic group: X represents a phenyl, naphthyl or anthranyl group. These aromatic groups may have a substituent. Examples of such substituents for the aromatic groups are organic groups having 1 to 100 carbon atoms. Specific examples of such organic groups are all of the organic groups listed below in connection with the compounds represented by the following general formulas (I-A) and (I-B). In these formulas, when the both A and B are present, the surfactant may be a random or block copolymer.

Specific examples of the compounds represented by Formula (1) include those represented by the following general formulas (1-A) and (1-B):

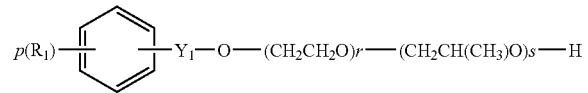

1-A

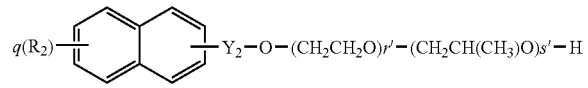

1-B wherein, each of $R_1$ and $R_2$ represents a hydrogen atom or an organic group having 1 to 100 carbon atoms; each of p and q represents 1 or 2; each of $Y_1$ and $Y_2$ represents a single bond or an alkylene group having 1 to 10 carbon atoms; each of r and s represents 0 or an integer ranging from 1 to 100, provided that r and s do not simultaneously represent 0 and that if either r or s represents 0, r and s are not 1; and each of r' and s' represents 0 or an integer falling within the range of from 1 to 100, provided that r' and s' do not simultaneously represent 0 and that if either r' or s' represents 0, r' and s' are not 1.

In this respect, however, if p represents 2 and $R_1$ represents an organic group having 1 to 100 carbon atoms, the group $R_1$ may be the same or different or these groups $R_1$ may form a ring together. Moreover, if q represents 2 and $R_2$ represents an organic group having 1 to 100 carbon atoms, the group $R_2$ may be the same or different or these groups $R_2$ may form a ring together.

Specific examples of the foregoing organic groups each having 1 to 100 carbon atoms include saturated or unsaturated, linear or branched aliphatic hydrocarbon groups and aromatic hydrocarbon groups such as alkyl, alkenyl, alkynyl, aryl and aralkyl groups; and other organic groups such as alkoxy, aryloxy, N-alkylamino, N,N-di-alkylamino, N-arylamino, N,N-di-arylamino, N-alkyl-N-arylamino, acyloxy, carbamoyl-oxy, N-alkyl-carbamoyloxy, N-aryl-carbamoyloxy, N,N,-di-alkyl-carbamoyloxy, N,N-di-aryl-carbamoyloxy, N-alkyl-N-aryl-carbamoyloxy, acylamino, N-alkyl-acylamino, N-aryl-acylamino, acyl, alkoxy-carbonylamino, alkoxy-carbonyl, aryloxy-carbonyl, carbamoyl, N-alkyl-carbamoyl, N,N-di-alkyl-carbamoyl, N-aryl-carbamoyl, N,N-di-aryl-carbamoyl, N-alkyl-N-aryl-carbamoyl, polyoxyalkylene chains, and the organic groups listed above to which a polyoxyalkylene chain is bonded. The foregoing alkyl groups may be either linear or branched ones.

Examples of preferred groups $R_1$ and $R_2$ include a hydrogen atom, linear or branched alkyl groups having 1 to 10 carbon atoms, alkoxy groups having 1 to 10 carbon atoms, alkoxycarbonyl groups, N-alkylamino groups, N,N-di-alkylamino groups, N-alkyl-carbamoyl groups, acyloxy or acylamino groups, polyoxyalkylene chains comprising about 5 to 20 repeating units, aryl groups having 6 to 20 carbon atoms, and aryl groups each having a polyoxyalkylene chain comprising about 5 to 20 repeating units bonded thereto.

In the compounds represented by the general formulas (1-A) and (1-B), the number of repeating units present in each polyoxyethylene chain preferably ranges from 3 to 50 and more preferably 5 to 30. The number of repeating units present in each polyoxypropylene chain preferably ranges from 0 to 10 and more preferably 0 to 5. In this respect, these polyoxyethylene and polyoxypropylene moieties may be either random or block copolymers.

Examples of the compounds represented by the general formula (1-A) are polyoxyethylene phenyl ether, polyoxyethylene methyl-phenyl ether, polyoxyethylene octyl-phenyl ether, and polyoxyethylene nonyl-phenyl ether.

Examples of the compounds represented by the general formula (1-B) include polyoxyethylene naphthyl ether, polyoxyethylene methyl-naphthyl ether, polyoxy-ethylene octyl-naphthyl ether, and polyoxyethylene nonyl-naphthyl ether.

In the developer of the present invention, the nonionic aromatic ether type surfactant may be used alone or in any combination of at least two of them.

The content of the nonionic aromatic ether type surfactant in the developer suitably ranges from 1 to 10% by weight and more preferably 2 to 8% by weight on the basis of the total weight of the developer. In this connection, if the added amount thereof is too small, the resulting developer has a reduced developing ability and the reduction in the ability of solubilizing the components of an image-recording layer, while if it is too large, the resulting printing plate would have a reduced printing durability.

Specific examples of nonionic aromatic ether type surfactants represented by the general formulas (1-A) and (1-B) will be listed below:

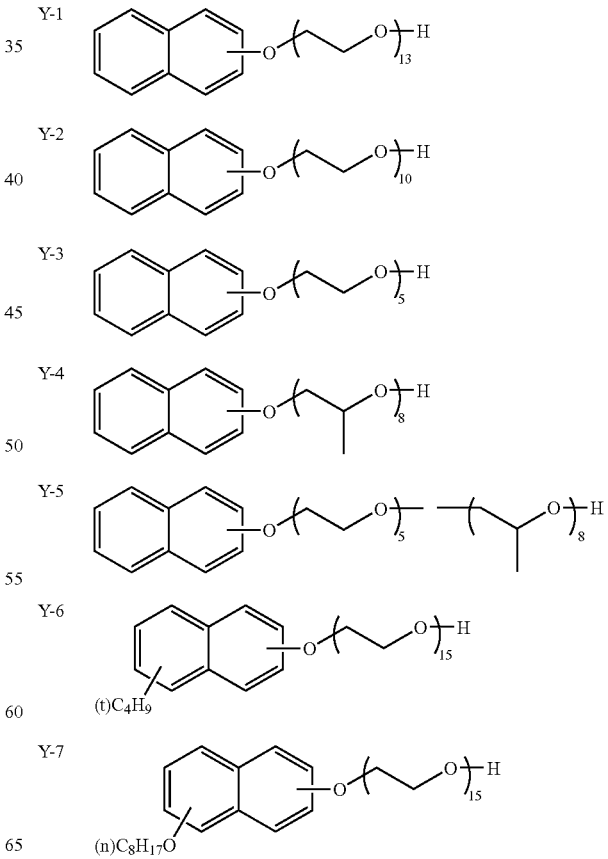

-continued

| A—W |
|---|
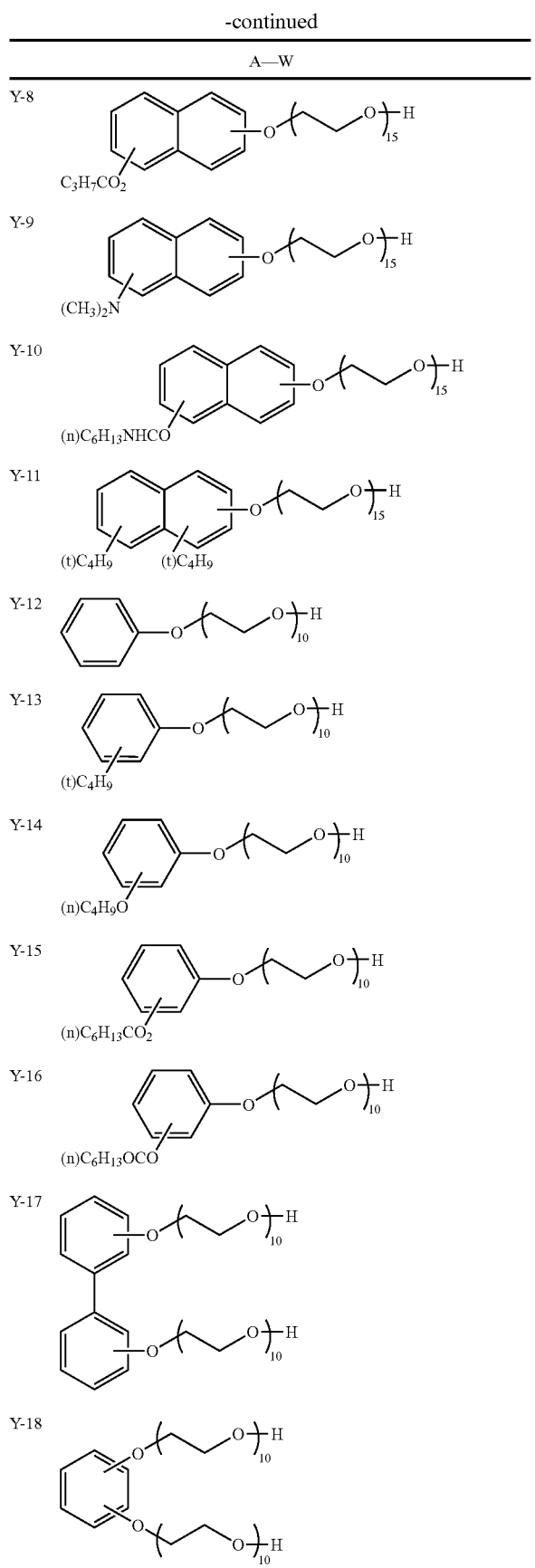

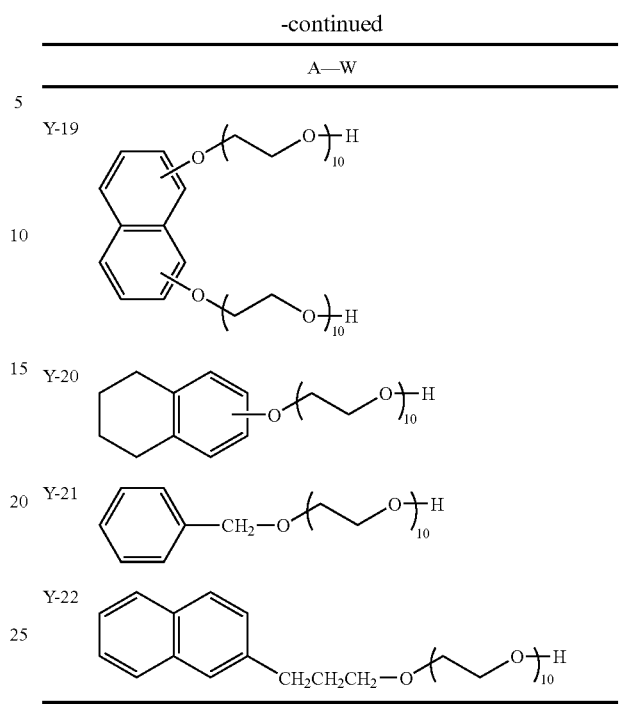

In addition, the developer usable in the plate-making method of the present invention may likewise comprise other surfactants listed below in addition to the nonionic aromatic ether type surfactants represented by the general formulas (1-A) and (1-B).

Examples of other surfactants usable herein are nonionic surfactants, for instance, polyoxyethylene alkyl ethers such as polyoxyethylene lauryl ether, polyoxyethylene cetyl ether and polyoxyethylene stearyl ether, polyoxyethylene alkyl esters such as polyoxyethylene stearate, sorbitan alkyl esters such as sorbitan mono-laurate, sorbitan mono-stearate, sorbitan di-stearate, sorbitan mono-oleate, sorbitan sesqui-oleate, sorbitan tri-oleate, and mono-glyceride alkyl esters such as glycerol mono-stearate and glycerol mono-oleate; anionic surfactants, for instance, alkylbenzene sulfonic acid salts such as sodium dodecyl-benzene sulfonate, alkyl-naphthalene sulfonic acid salts such as sodium butyl-naphthalene sulfonate, sodium pentyl-naphthalene sulfonate, sodium hexyl-naphthalene sulfonate and sodium octyl-naphthalene sulfonate, alkyl-sulfuric acid salts such as sodium lauryl sulfate, alkyl-sulfonic acid salts such as sodium dodecyl-sulfonate, and sulfo-succinic acid ester salts such as sodium di-lauryl sulfosuccinate; and amphoteric surfactants, for instance, betaines such as lauryl betaine and stearyl betaine, and amino acids, with anionic surfactants such as alkyl-naphthalene sulfonic acid salts being particularly preferred. These additional surfactants may be used alone or in any combination. Moreover, the content of these surfactants in the developer of the invention preferably ranges from 0.1 to 20% by weight as expressed in terms of the content of the effective component.

(Anionic Surfactant)

Examples of anionic surfactants usable in the present invention include compounds comprising at least one anionic group in its molecule. Examples of anionic group include carboxylate anion or carbonate anion, sulfonate anion, sulfinate anion, sulfate anion, sulfite anion, phosphate anion, phosphite anion, phosphonate anion, phosphinate anion, and preferably sulfonate anion or sulfate anion. More specifically, anionic surfactants include compounds having at least one sulfonate anion or sulfate anion, and preferably, a compound comprising an anion of sulfonic acid or an anion of sulfonic acid mono ester and at least one optionally substituted aromatic group.

Preferably, the compounds comprising at least one anion of sulfonic acid or anion of sulfonic acid mono ester are compounds represented by the following general formula (2) or (3).

$$R_{10}SO_3. \quad (2);$$

$$R_{20}-O-SO_3. \quad (3)$$

wherein, $R_{10}$, $R_{20}$ each represents an optionally substituted alkyl group, an optionally substituted cycloalkyl group, an optionally substituted alkenyl group, an optionally substituted aryl group.

The "alkyl group" includes an alkyl group having 1 to 20 carbon atoms and more specifically, includes methyl, ethyl, propyl, n-butyl, sec-butyl, hexyl, 2-ethylhexyl, octyl, decyl, dodecyl, hexadecyl, stearyl groups.

The "cycloalkyl-group" may be monocyclic or multicyclic group. Examples of monocyclic group include a group having 3 to 8 carbon atoms and more specifically, include cyclopropyl, cyclopentyl, cyclohexyl and cyclooctyl group. Examples of multicyclic group include adamantyl, norbornyl, isobornyl, camphanyl, dicyclopentyl, α-pinel and tricylodecanyl groups.

Examples of alkenyl group include an alkenyl group comprising 2 to 20 carbon atoms and more specifically, include vinyl, allyl, butenyl, and cyclohexenyl.

Examples of aralkyl group include an aralkyl group comprising 7 to 12 carbon atoms and more specifically, include benzyl, phenethyl, naphthylmethyl group.

Examples of aryl group include an aryl group having 6 to 15 carbon atoms and more specifically, include phenyl, tolyl, dimethylphenyl, 2,4,6-trimethylphenyl, naphthyl, anthryl, 9,10-dimethoxyanthryl group.

Examples of substituents in the groups described above include a monovalent group of non-metallic atoms except hydrogen atom. Preferred examples thereof include halogen atoms (F, Br, Cl, I), hydroxyl, alkoxy, aryloxy, acyl, amide, ester, acyloxy, carboxy, carboxylate anion, or sulfonate anion.

Specific examples of alkoxy group described above include an alkoxy group comprising 1 to 40 carbon atoms, preferably 1 to 20 carbon atoms such as methoxy, ethoxy, propyloxy, isopropyloxy, butyloxy, pentyloxy, hexyloxy, dodecyloxy, stearyloxy, methoxyethoxy, poly(ethyleneoxy), and poly(propyleneoxy) groups. Examples of aryloxy group include a group comprising 6 to 18 carbon atoms such as phenoxy, tolyloxy, xylyloxy, mesityloxy, cumenyloxy, methoxyphenyloxy, ethoxyphenyloxy, chlorophenyloxy, bromophenyloxy, and naphthyloxy groups. Examples of acyl group include a group comprising 2 to 24 carbon atoms such as acetyl, propanoyl, butanoyl, benzoyl, and naphthoyl groups. Examples of amide group include a group comprising 2 to 24 carbon atoms such as acetamide, propionamide, dodecanoc acid amide, palmitic acid amide, stearic acid amide, benzoylamide, and naphthoic acid amide groups. Examples of acyloxy group include a group having 2 to 20 carbon atoms such as acetoxy, propanoyloxy, benzoyloxy, and naphthoyloxy groups. Examples of ester group include a group having 1 to 24 carbon atoms such as methyl ester, ethyl ester, propyl ester, hexyl ester, octyl ester, dodecyl ester and stearyl ester group. The substituents may be a combination of two or more groups described above.

Examples of the compounds represented by the general formula (2) and (3) are shown below, but the present invention is not limited thereto.

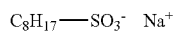 (I-1)

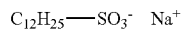 (I-2)

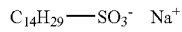 (I-3)

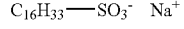 (I-4)

(I-5)

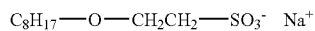

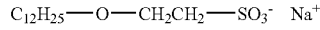 (I-6)

(I-7)

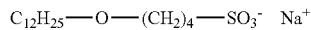

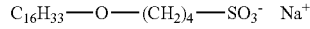 (I-8)

(I-9)

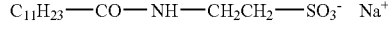

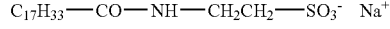 (I-10)

(I-11)

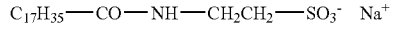

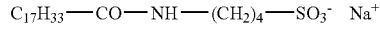 (I-12)

(I-13)

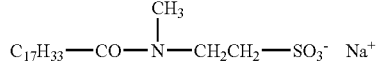

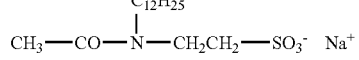 (I-14)

-continued
(I-15)
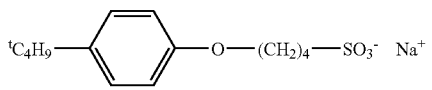
(I-16)
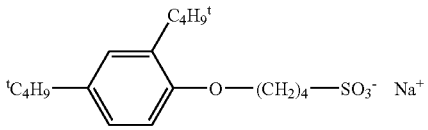
(I-17)
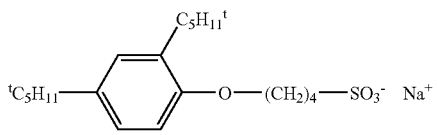
(I-18)
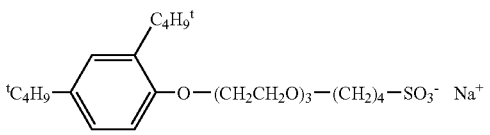
(I-19)
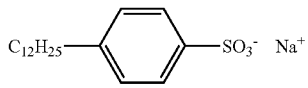
(I-20)
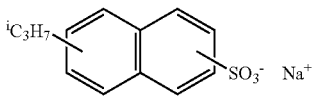
(I-21)
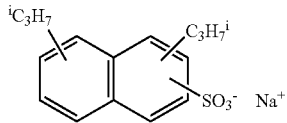
(I-22)
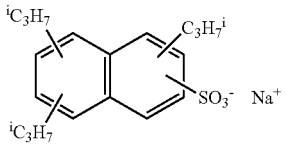
(I-23)
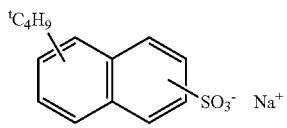
(I-24)
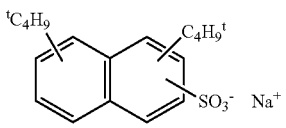
(I-25)
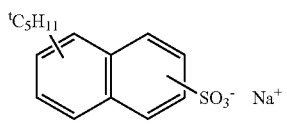
(I-26)
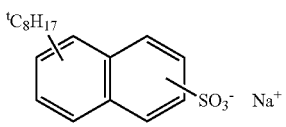
(I-27)
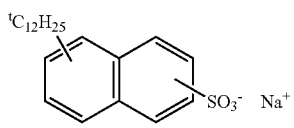
(I-28)
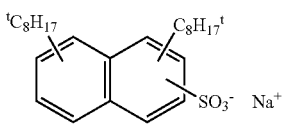
(I-29)
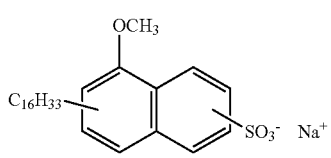
(I-30)
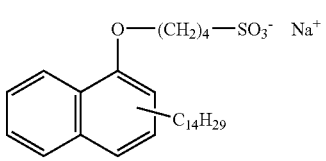
(I-31)
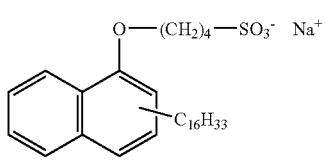
(I-32)
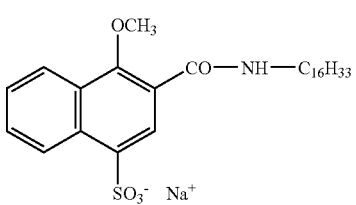
(I-33)
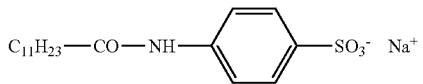
(I-34)
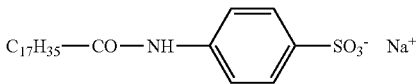

-continued (I-35) Structure: C₁₇H₃₅—CO—NH—[benzene ring with two SO₃⁻ Na⁺ groups]

(I-36) Structure: [naphthalene ring with O—CO—C₉H₁₉ at top and SO₃⁻ Na⁺ at bottom]

(I-37) Structure: [naphthalene ring with O—CO—C₁₂H₂₅ and two SO₃⁻ Na⁺ groups]
⁺Na ⁻O₃S—[naphthalene]—SO₃⁻ Na⁺

(I-38) Structure: [naphthalene ring with O—CO—C₁₇H₃₅ and two SO₃⁻ Na⁺ groups]
⁺Na ⁻O₃S—[naphthalene]—SO₃⁻ Na⁺

(I-39) ᵗC₄H₉—[phenyl]—O—CH₂
        ᵗC₄H₉—[phenyl]—O—CH₂—CH—O—(CH₂)₄—SO₃⁻ Na⁺

(I-40) C₈H₁₇—O—CH₂
       ᵗC₄H₉—[phenyl]—O—CH₂—CH—O—(CH₂)₄—SO₃⁻ Na⁺

(I-41) C₄H₉—O—CH₂
       ᵗC₄H₉—[phenyl]—O—CH—O—(CH₂)₄—SO₃⁻ Na⁺
       —O—CH₂

(I-42) C₈H₁₇—O—CH₂
       C₈H₁₇—O—CH—O—(CH₂)₄—SO₃⁻ Na⁺

(I-43) CH₂—COO—C₄H₉ⁱ
       ⁺Na ⁻O₃S—CH—COO—C₄H₉ⁱ

(I-44) CH₂—COO—C₆H₁₃
       ⁺Na ⁻O₃S—CH—COO—C₆H₁₃

(I-45) CH₂—COO—C₈H₁₇
       ⁺Na ⁻O₃S—CH—COO—C₈H₁₇

(I-46) 
       $C_2H_5$
       CH₂—COO—CH₂CHC₄H₉
       ⁺Na ⁻O₃S—CH—COO—CH₂CHC₄H₉
                              $C_2H_5$ (I-47) C₁₄H₂₉CH—COOCH₃
             |
             SO₃⁻ Na⁺

(I-48) CH₂—COO—C₄H₉ⁱ
       HO—C—COO—C₄H₉ⁱ
       ⁺Na ⁻O₃S—CH—COO—C₄H₉ⁱ

(I-49) 
$$H_3C-CH(CH_3)-CH_2-C(CH_3)(O-(CH_2CH_2O)_x-H)-C\equiv C-C(CH_3)(O-(CH_2CH_2O)_y-(CH_2)_4-SO_3^- Na^+)-CH_2-CH(CH_3)-CH_3$$

(I-50)
$$^+Na \; ^-O_3S-(CH_2)_4-O-(CH_2CH_2O)_x-C(CH_3)(...)-C\equiv C-C(CH_3)(O-(CH_2CH_2O)_y-(CH_2)_4-SO_3^- Na^+)-CH_2-CH(CH_3)-CH_3$$

(II-1) C₈H₁₇—O—SO₃⁻ Na⁺

(II-2) C₁₀H₂₁—O—SO₃⁻ Na⁺

(II-3) C₁₂H₂₅—O—SO₃⁻ Na⁺

(II-4) C₁₆H₃₃—O—SO₃⁻ Na⁺

-continued (II-5)
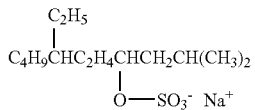

(II-6)
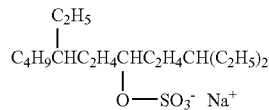

(II-7)
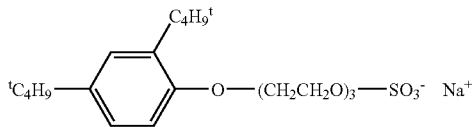

(II-8)
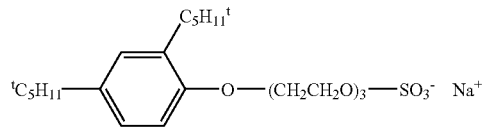

(II-9)
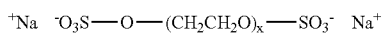

$^+Na\ ^-O_3S-O-(CH_2CH_2O)_x-SO_3^-\ Na^+$ (II-10)

$^+Na\ ^-O_3S-O-(CH_2CHO)_y-SO_3^-\ Na^+$ with CH$_3$ branch (I-11)
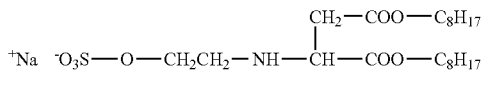

(II-12)
$C_{17}H_{35}-CO-NH-CH_2CH_2-O-SO_3^-\ Na^+$ (II-13)
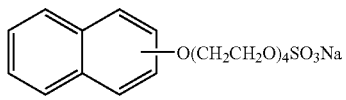
O(CH$_2$CH$_2$O)$_4$SO$_3$Na (II-14)
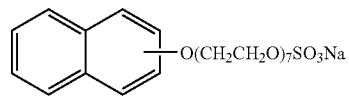
O(CH$_2$CH$_2$O)$_7$SO$_3$Na (II-15)
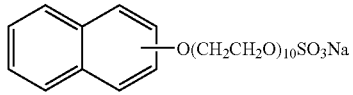
O(CH$_2$CH$_2$O)$_{10}$SO$_3$Na (II-16)
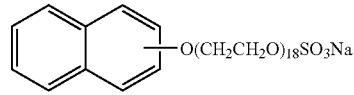
O(CH$_2$CH$_2$O)$_{18}$SO$_3$Na (II-17)
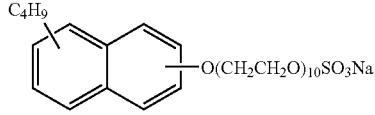

(II-18)
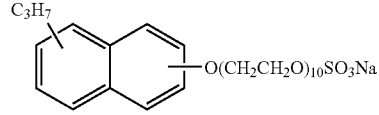

(II-19)
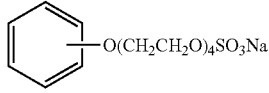

(II-20)
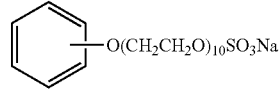

(II-21)
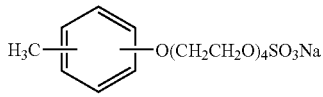

(II-22)
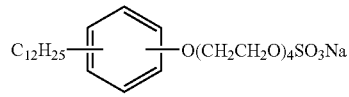

In the above examples, x and y represent the numbers of repeating units or ethyleneoxy chains and propyleneoxy chains, respectively and they are integers each ranging from 1 to 20 (average values).

In addition, among the compounds of general formula (2) and (3), the compounds represented by (2-a) and (3-a) are preferred in the light of the effect of the present invention.

(2-a)
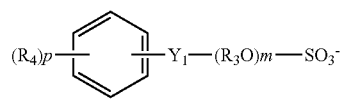

(3-a)
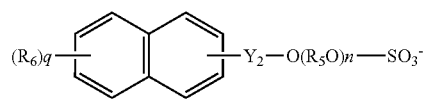

wherein, $R_3$, $R_5$ each represents a linear or branched alkylene group having 1 to 5 carbon atoms; $R_4$, $R_6$ each represents a linear or branched alkyl group having 1 to 20 carbon atoms; p, q each represents 0 to 2; $Y_1$, $Y_2$ each represents a bond or an alkylene group having 1 to 10 carbon atoms; n, m each represents an integer of 0 to 100, provided that if n and m are not less than 2, $R_3$ or $R_5$ may be selected from at least two kinds of groups.

The content of the compounds represented by the general formula (2) or (3) in the developer of the invention suitably ranges from 1 to 10% by weight and preferably 2 to 10% by weight as expressed in terms of the content of the effective component.

In this respect, if the added amount of the compound is too small, the resulting developer has a reduced developing ability and a low ability of solubilizing the components of the light-sensitive layer, while if it is too large, the resulting developer would reduce the printing durability of the printing plate ultimately prepared.

The compounds represented by general formula (2) and (3) are commercially available. Examples of the commercially available products are those manufactured by Asahi Denka Co. Ltd., Kao Corporation, Sanyo Chemical Industries Ltd., New Japan Chemical Co. Ltd., Daiichi Kogyo Seiyaku Co. Ltd., Takemoto Oil and Fats Co. Ltd., Toho Chemical Industry Co. Ltd., and NOF Corporation.

Examples of other surfactants usable herein are nonionic surfactants, for example, polyoxyethylene alkyl ethers such as polyoxyethylene naphthyl ether, polyoxyethylene alkylphenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate, and sorbitan trioleate, mono-glyceride alkyl esters such as glycerol mono-stearate and glycerol mono-oleate.

These surfactants can be alone or in combination. The content of these surfactants in the developer of the invention preferably ranges from 0.1 to 10% by weight as expressed in terms of the content of the effective component.

The developer used in the image-forming method of the present invention comprises at least one surfactant selected from the group consisting of the anionic surfactant and the nonionic aromatic ether type surfactants listed above in an amount ranging from 1.0 to 10% by weight, further comprises at least one carbonate and at least one hydrogen carbonate, and has a pH value ranging from 8.5 to 11.5 and an electrical conductivity x falling within the range: $30<x<100$ mS/cm. In this respect, the pH and conductivity values are those determined at ordinary temperature (about 25° C.).

The foregoing at least one carbonate and at least one hydrogen carbonate serve as alkaline agents in the developer. The carbonate may be at least one compound selected from the group consisting of carbonates of inorganic alkalis and organic alkalis and more preferably at least one compound selected from the group consisting of carbonates of inorganic alkalis. Specific examples of such carbonates are sodium carbonate, potassium carbonate and ammonium carbonate, with sodium carbonate and potassium carbonate being further preferred.

The hydrogen carbonate may be at least one compound selected from the group consisting of hydrogen carbonates of inorganic alkalis and organic alkalis and more preferably at least one compound selected from the group consisting of hydrogen carbonates of inorganic alkalis. Specific examples of such hydrogen carbonates are sodium hydrogen carbonate, potassium hydrogen carbonate and ammonium hydrogen carbonate, with sodium and potassium hydrogen carbonates being further preferred.

It is preferred to adjust the concentration of the carbonate in the developer to the range of from 0.005 to 1 mole/L and to adjust that of the hydrogen carbonate to the range of from 0.001 to 1 mole/L, whereby these components show pH-buffering action within the pH range of from 8.5 to 11.5 and the amount of carbon dioxide absorbed by the resulting developer can be reduced.

Moreover, it is essential in the present invention that the developer has a pH value ranging from 8.5 to 11.5 and preferably 9.0 to 11.0. In addition, it is likewise essential in the present invention that the electrical conductivity x of the developer falls within the range: $30<x<100$ mS/cm, preferably in the range of from 31 to 80 mS/cm and more preferably 35 to 60 mS/cm.

In this connection, an alkali metal salt of an organic or inorganic acid may further be added to the developer as a conductivity-controlling agent to thus appropriately adjust the conductivity of the developer.

When a developer comprises alkali metal salts other than the mixture of a carbonate and a hydrogen carbonate, the resulting developer undergoes a decrease of the developing ability with the lapse of time and due to the repeated use thereof even when the pH value and the conductivity fall within the ranges specified above, respectively. If the pH value is smaller than the lower limit, any image cannot be formed even when the developer comprises a mixture of a carbonate and a hydrogen carbonate, while if it exceeds the upper limit, the developing ability of the developer is reduced due to the deterioration of the developer through the absorption of carbon dioxide in the air. On the other hand, if the conductivity is lower than the lower limit, it becomes difficult to dissolve the layer of an image-recording composition formed on the surface of an aluminum substrate and as a result, any image cannot be formed, while if it exceeds the upper limit, a part of the non-image area remains un-removed. In any case, the developing quality of the developer is impaired.

The foregoing developer may be one prepared by using a single aqueous solution containing the both carbonate and hydrogen carbonate dissolved therein or by separately preparing aqueous solutions containing these components, respectively and then mixing these aqueous solutions.

In addition, the foregoing developer may further comprise an additional alkaline agent selected from the group consisting of, for instance, inorganic alkaline agents such as sodium, potassium and ammonium tertiary phosphates, sodium, potassium and ammonium borates, and sodium, potassium, ammonium and lithium hydroxides; and organic alkaline agents such as mono-methylamine, di-methylamine, tri-methylamine, mono-ethylamine, di-ethylamine, tri-ethylamine, mono-isopropylamine, di-isopropyl-amine, tri-isopropylamine, n-butylamine, mono-ethanolamine, di-ethanolamine, tri-ethanolamine, mono-isopropanolamine, di-isopropanolamine, ethyleneimine, ethylene-diamine, pyridine and tetramethyl-ammonium hydroxide. These alkaline agents may be used alone or in any combination.

A chelating agent may be added to the developer. Examples of such chelating agents include polyphosphoric acid salts such as $Na_2P_2O_7$, $Na_5P_3O_3$, $Na_3P_3O_9$, $Na_2O_4P$ $(NaO_3P)PO_3Na_2$, and Calgon (sodium polymetaphosphate); amino-polycarboxylic acids and salts thereof such as ethylenediamine-tetraacetic acid and potassium and sodium salts thereof, diethylene-triamine-pentaacetic acid and potassium and sodium salts thereof, triethylene-tetramine-hexaacetic acid and potassium and sodium salts thereof, hydroxyethyl ethylene-diamine-triacetic acid and potassium and sodium salts thereof, nitrilo-triacetic acid and potassium and sodium salts thereof, 1,2-diaminocyclohexane-tetraacetic acid and potassium and sodium salts thereof, and 1,3-diamino-2-propanol-tetraacetic acid and potassium and sodium salts thereof; and organic phosphonic acids and salts thereof such as 2-phosphono-butane-tricarboxylic acid-1,2,4 and potassium and sodium salts thereof, 2-phosphono-butanone-tri-carboxylic acid-2,3,4 and potassium and sodium salts thereof, 1-phosphono-ethane-tricarboxylic acid-1,2,2 and potassium and sodium salts thereof, 1-hydroxyethane-1,1-diphosphonic acid and potassium and sodium salts thereof, and aminotri(methylene-phosphonic acid) and potassium and sodium salts thereof. The optimum amount of such a chelating agent may vary in proportion to the hardness of hard water used and the amount thereof to be used, but it in general ranges from 0.01 to 5% by weight and more preferably 0.01 to 0.5% by weight on the basis of the weight of the developer practically used.

The developer of the present invention may optionally comprise additional components listed below in addition to the foregoing components. Examples of such additional components are organic carboxylic acids such as benzoic acid, phthalic acid, p-ethyl-benzoic acid, p-n-propyl-benzoic acid, p-isopropyl-benzoic acid, p-n-butyl-benzoic acid, p-t-butyl-benzoic acid, p-2-hydroxyethyl-benzoic acid, decanoic acid, salicylic acid and 3-hydroxy-2-naphthoic acid; organic solvents such as isopropyl alcohol, benzyl alcohol, ethyl cellosolve, butyl cellosolve, phenyl cellosolve, propylene glycol, and diacetone alcohol; as well as a chelating agent, a reducing agent, a dye, a pigment, a water softener and a preservative.

The foregoing developer can be used as a developer or a replenisher for use in the development of an exposed negative-working image-forming material and it is preferably used in an automatic developing machine. When developing an image-forming material in an automatic developing machine, the developer is fatigued in proportion to the throughput and therefore, the throughput capacity of the developer may be restored by the use of a replenisher or a fresh developer. This replenishing system may likewise preferably be adopted even in the image-forming method of the present invention. The intended effects of the present invention would be more conspicuous when using the foregoing developer in the development of an image-forming material as will be described below.

The image-forming material used in the present invention comprises a substrate provided thereon with an image-recording layer and an optional protective layer deposited on the substrate in order and the image-recording layer is characterized in that it comprises a photopolymerization initiator system sensitive to light rays whose wavelength falls within the visible to ultraviolet ranges, a polymerizable compound carrying at least one ethylenically unsaturated group and a binder polymer.

The term "deposited on the substrate in order" used herein means that an undercoating layer, an image-recording layer and a protective layer are formed on a substrate in this order. In this connection, the undercoating layer and the protective layer may, if necessary, be used and it is a matter of course that the image-forming material may likewise comprise other layers (such as an intermediate layer, a back coat layer or the like) used for a variety of purposes.

[Photopolymerization Initiator System Sensitive to Visible to Ultraviolet Light Rays]

The photopolymerization initiator system sensitive to visible to ultraviolet light rays herein used means a system comprising a compound capable of absorbing light rays whose wavelength falls within the visible to ultraviolet ranges and initiating a desired photopolymerization reaction. More specifically, examples thereof are combinations of sensitizing dyestuffs whose maximum absorption wavelength falls within the visible to ultraviolet ranges, preferably 330 to 700 nm with photopolymerization initiators. These photopolymerization initiators may be used in combination (a combined initiator system). As such photopolymerization initiator system, there may appropriately be used combinations of a variety of sensitizing dyestuffs (dyes) known from, for instance, patent articles and literature with photopolymerization initiators or combinations of at least two of them (combined systems). Specific examples thereof will be listed below, but the present invention is not restricted to these specific examples at all.

There have been proposed various kinds of photopolymerization initiator systems sensitive to light rays such as visible light rays of not less than 400 nm, an Ar laser beam, secondary harmonic waves (harmonics) emitted from a semiconductor laser and an SHG-YAG laser beam and examples thereof are certain kinds of optically reducing dyes disclosed in, for instance, U.S. Pat. No. 2,850,445; dyes such as Rose Bengale, eosine and erythrosine or systems comprising combinations of dyes and initiators; composite initiator systems comprising dyes and amines (Japanese Examined Patent Publication (hereunder referred to as "J.P. KOKOKU") Sho 44-20189); combined systems comprising hexa-aryl biimidazoles, radical generators and dyes (J.P. KOKOKU Sho 45-37377); systems comprising hexa-aryl biimidazoles and p-dialkylamino-benzylidene ketone (J.P. KOKOKU Sho 47-2528 and Japanese Un-Examined Patent Publication (hereunder referred to as "J.P. KOKAI") Sho 54-155292); systems comprising cyclic cis-α-dicarbonyl compounds and dyes (J.P. KOKAI Sho 48-84183); systems comprising cyclic triazines and merocyanine dyes (J.P. KOKAI Sho 54-151024); systems comprising 3-ketocumarin and activators (J.P. KOKAI Nos. Sho 52-112681 and Sho 58-15503); systems comprising biimidazoles, styrene derivatives and thiols (J.P. KOKAI Sho 59-140203); systems comprising organic peroxides and dyes (J.P. KOKAI Nos. Sho 59-1504, Sho 59-140203, Sho 59-189340 and Sho 62-174203, J.P. KOKOKU Sho 62-1641 and U.S. Pat. No. 4,766,055); systems comprising dyes and activated halogen atom-containing compounds (see, for instance, J.P. KOKAI Nos. Sho 63-258903 and Hei 2-63054); systems comprising dyes and borate compounds (see, for instance, J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204); systems comprising dyes each having a rhodanine ring and radical generators (J.P. KOKAI Nos. Hei 2-179643 and Hei 2-244050); systems comprising titanocenes and 3-ketocumarin dyes (J.P. KOKAI Sho 63-221110); systems comprising combinations of titanocenes, xanthene dyes and addition polymerizable ethylenically unsaturated compounds having amino or urethane groups (J.P. KOKAI Nos. Hei 4-221958 and Hei 4-219756); systems comprising titanocenes and specific merocyanine dyes (J.P. KOKAI Hei 6-295061); and systems comprising titanocenes and benzopyran ring-containing dyes (J.P. KOKAI Hei 8-334897).

Moreover, there have recently been developed a laser (violet laser) emitting light rays of 400 to 410 nm and a photopolymerization initiator system highly sensitive to light rays of not more than 450 nm or the light rays emitted from a violet laser and these photo-initiator systems can likewise be used in the present invention. Examples thereof are cationic dye/borate systems (J.P. KOKAI Hei 11-84647); merocyanine dye/titanocene systems (J.P. KOKAI 2000-147763); and carbazole type dye/titanocene systems (J.P. KOKAI 2001-42524). In the present invention, titanocene compound-containing photopolymerization initiator systems are particularly preferred since they are excellent in their sensitivity.

A variety of such titanocene compounds may be used herein and they may appropriately be selected from a variety of such titanocene compounds disclosed in, for instance, J.P. KOKAI Nos. Sho 59-152396 and Sho 61-151197. Specific examples thereof are di-cyclopentadienyl-Ti-di-chloride, di-cyclopentadienyl-Ti-bis-phenyl, di-cyclopenta-dienyl-Ti-bis-2,3,4,5,6-pentafluorophen-1-yl, di-cyclopentadienyl-Ti-bis-2,3,5,6-tetra-fluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-di-fluorophen-1-yl, di-methyl-cyclopentadienyl-Ti-bis-2,3,4,5,6-pentafluorophen-1-yl, di-methyl-cyclopenta-dienyl-Ti-bis-2,6-di-fluorophen-1-yl and di-cyclopentadienyl-Ti-bis-2,6-di-fluoro-3-(pyrro-1-yl)-phen-1-yl.

Moreover, the photopolymerization initiator system preferably comprises the foregoing titanocene compound and further a triazine compound. Examples of such triazine compounds usable herein in combination with the titanocene compounds include halo-methyl triazine compounds represented by the following general formula (I):

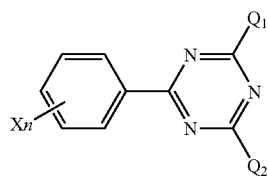

(I)

In the formula (I), each of $Q_1$ and $Q_2$ independently represents a halo-methyl group; X represents an electron attractive substituent whose Hammett's σ value falls within the range of from 0 to +0.8, except for COOH group; and n represents an integer ranging from 0 to 5.

In this connection, the Hammett's σ value used in the present invention is defined in "Theory of Organic Reaction Rate", written by J. E. Leffler (translated by TSUNO Yunan), Tokyo Hirokawa Publishing Company, 1968.

In the triazine compounds of Formula (I) used in the present invention, specific examples of the substituents X whose Hammett's σ value falls within the range of from 0 to +0.8 include phenyl groups, phenyl groups substituted with electron attractive groups, naphthyl groups, trifluoromethyl group, cyano groups, acetyl groups, ethoxy-carbonyl group, —PO$_3$H group, phosphonyl groups substituted with alkyl groups, thiocyano groups, methyl-sulfonyl group, ethyl-sulfonyl group, dimethyl-sulfonyl group, fluorine atom, chlorine atom, bromine atom, iodine atom and iodyl group.

Among the substituents X listed above, preferred are hydrogen atom, chlorine atom, bromine atom, cyano groups, trifluoromethyl group, acetyl groups, phenyl groups and phenyl groups substituted with electron attractive groups.

Specific examples of the compounds represented by the general formula (I) are those listed below, but the present invention is not restricted to these specific ones at all:

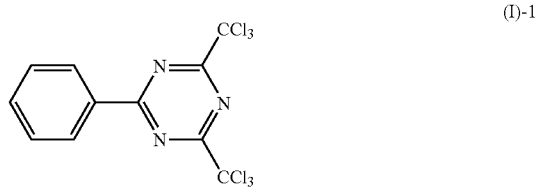

(I)-1

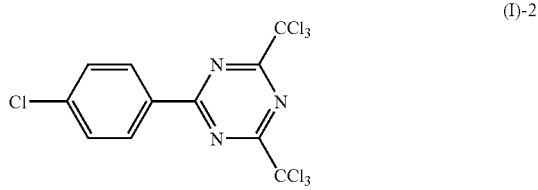

(I)-2

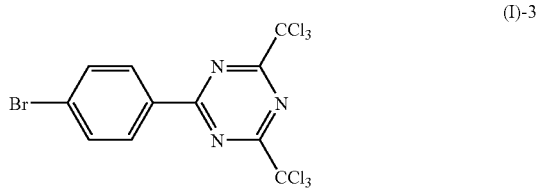

(I)-3

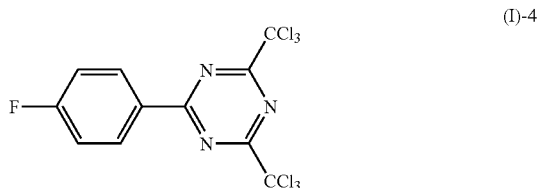

(I)-4

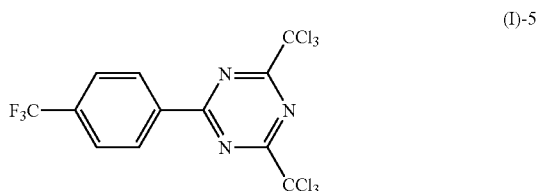

(I)-5

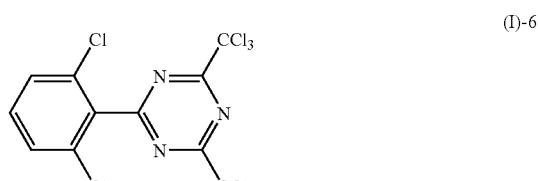

(I)-6

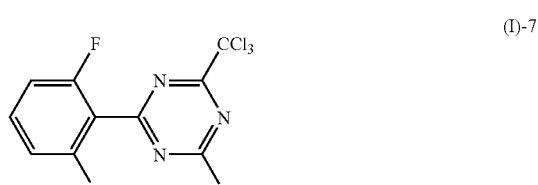

(I)-7

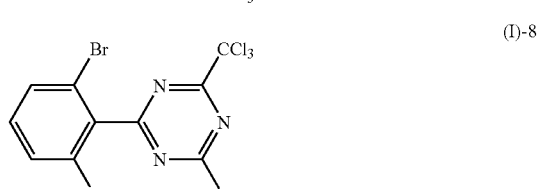

(I)-8

-continued

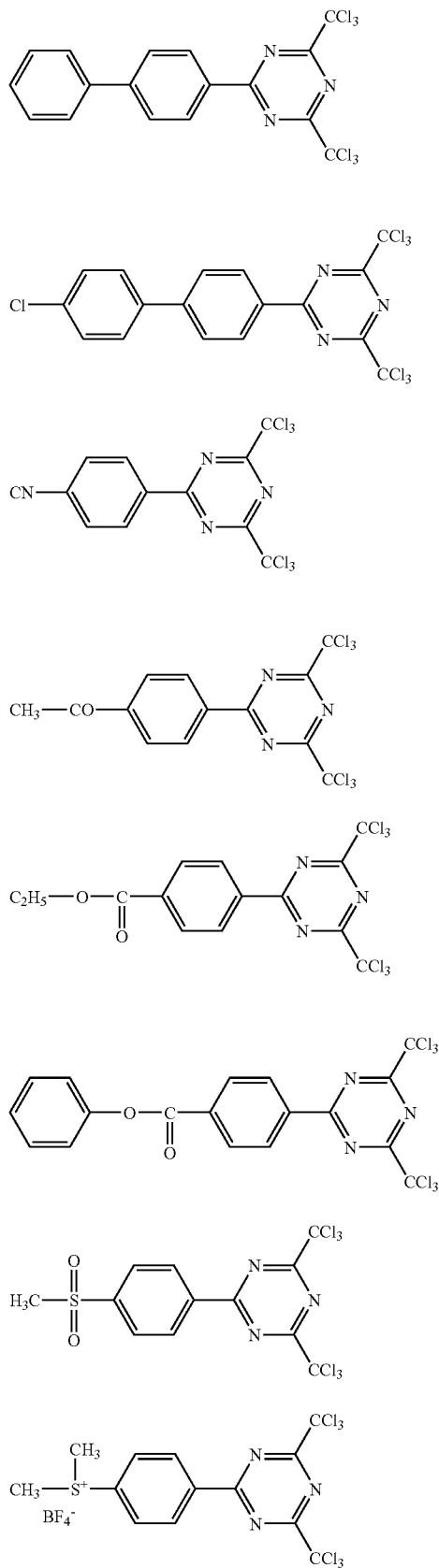

Further, it has been recognized that the optional addition of a hydrogen-donating compound to the foregoing photopolymerization initiator system would permit the further improvement of the ability of initiating photopolymerization of the system and examples of such hydrogen-donating compounds include thiol compounds such as 2-mercapto-benzothiazole, 2-mercapto-benzimidazole and 2-mercapto-benzoxazole; and amine compounds such as N-phenyl glycine and N,N-dialkylamino aromatic alkyl ester. The amount of the photopolymerization initiator system to be incorporated into the image-forming material ranges from 0.05 to 100 parts by weight, preferably 0.1 to 70 parts by weight and more preferably 0.2 to 50 parts by weight, per 100 parts by weight of the ethylenically unsaturated compound as will be detailed below.

[Polymerizable Compound Carrying at Least One Ethylenically Unsaturated Group]

The term "polymerizable compound carrying at least one ethylenically unsaturated group" (hereunder also referred to as "ethylenically unsaturated bond-containing compound") herein used means a compound having at least one ethylenically unsaturated group which can undergo addition polymerization, cross-linking and/or curing by the action of a photopolymerization initiator when a composition for forming an image-recording layer is irradiated with actinic rays. Such a compound having at least one addition-polymerizable ethylenically unsaturated group can arbitrarily be selected from the group consisting of compounds carrying at least one terminal ethylenically unsaturated bond, preferably at least two such bonds. These ethylenically unsaturated bond-containing compounds may be in the chemical forms such as monomers, prepolymers, or dimmers, trimers and oligomers, or mixture thereof, as well as copolymers thereof.

Examples of monomers and copolymers thereof are esters of unsaturated carboxylic acids (such as acrylic acid, methacrylic acid, itaconic acid, crotonic acid, isocrotonic acid and maleic acid) with aliphatic polyhydric alcohol compounds; and amides of unsaturated carboxylic acids with aliphatic polyvalent amine compounds. Specific examples of ester monomers of unsaturated carboxylic acids with aliphatic polyhydric alcohol compounds are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol-propane triacrylate, trimethylol-propane tri(acryloyloxy-propyl) ether, trimethylol-ethane triacrylate, hexane-diol diacrylate, 1,4-cyclohexane-diol diacrylate, tetraethylene glycol diacrylate, pentaerythritol diacrylate, pentaerythritol triacrylate, pentaerythritol tetra-acrylate, di-pentaerythritol diacrylate, di-pentaerythritol penta-acrylate, di-pentaerythritol hexa-acrylate, sorbitol triacrylate, sorbitol tetra-acrylate, sorbitol penta-acrylate, sorbitol hexa-acrylate, tri(acryloyloxy-ethyl) isocyanurate, and polyester acrylate oligomers.

Examples of methacrylic acid esters are tetramethylene glycol di-methacrylate, triethylene glycol di-methacrylate, neopentyl glycol di-methacrylate, trimethylol-propane tri-methacrylate, trimethylol-ethane tri-methacrylate, ethylene glycol di-methacrylate, 1,3-butanediol di-methacrylate, hexane-diol di-methacrylate, pentaerythritol di-methacrylate, pentaerythritol tri-methacrylate, pentaerythritol tetra-methacrylate, di-pentaerythritol di-methacrylate, di-pentaerythritol hexa-meth-acrylate, di-pentaerythritol penta-methacrylate, sorbitol tri-methacrylate, sorbitol tetra-methacrylate, bis[p-(3-methacryloxy-2-hydroxypropoxy)phenyl]dimethyl-methane and bis[p -(methacryloxy-methoxy)phenyl] dimethyl-methane.

Examples of itaconic acid esters are ethylene glycol di-itaconate, propylene glycol di-itaconate, 1,5-butanediol di-itaconate, 1,4-butanediol di-itaconate, tetramethylene glycol di-itaconate, pentaerythritol di-itaconate, and sorbitol tetra-itaconate. Examples of isocrotonic acid esters are ethylene glycol di-isocrotonate, pentaerythritol di-isocrotonate, and sorbitol tetra-isocrotonate.

Examples of maleic acid esters are ethylene glycol di-maleate, triethylene glycol di-maleate, pentaerythritol di-maleate, and sorbitol tetra-maleate. In addition, the foregoing ester monomers may be used in combination. Further, specific examples of amide monomers of aliphatic polyvalent amine compounds with unsaturated carboxylic acids are methylene-bis-acrylamide, methylene-bis-methacrylamide, 1,6-hexa-methylene-bis-acrylamide, 1,6-hexamethylene-bis-methacrylamide, diethylene triamine tri-acrylamide, xylylene-bis-acrylamide and xylylene-bis-methacrylamide.

Examples of other ethylenically unsaturated bond-containing compounds are vinyl urethane compounds having at least two polymerizable vinyl groups in the molecule obtained by adding vinyl monomers having hydroxyl groups represented by the following general formula (A) to polyisocyanate compounds having at least two isocyanate groups in the molecule such as those disclosed in J.P. KOKOKU Sho 48-41708:

CH$_2$=C(R)COOCH$_2$CH(R')OH     (A)

Wherein R and R' represent H or CH$_3$, respectively.

Examples of such monomers or the like further include urethane acrylates such as those disclosed in J.P. KOKAI Sho 51-37193 and J.P. KOKOKU Hei 2-32293; polyester acrylates such as those disclosed in J.P. KOKAI Sho 48-64183 and J.P. KOKOKU Nos. Sho 49-43191 and Sho 52-30490; polyfunctional acrylates and methacrylates such as epoxy acrylates obtained by reacting epoxy resins with (meth)acrylic acids. Examples of the foregoing compounds likewise include those introduced as photo-setting monomers and oligomers in Bulletin of Adhesive Society in Japan, 1984, Vol. 20, No. 7, pp. 300–308. In this respect, the amount of these ethylenically unsaturated bond-containing compounds to be used ranges from 5 to 80% by weight and preferably 30 to 70% by weight on the basis of the total weight of the whole components present in the image-recording layer.

[Binder Polymer]

The binder polymer used in the image-recording layer of the image-forming material employed in the present invention should serve as a film-forming agent in the image-recording layer and should be soluble in an alkaline developer and accordingly, it is an organic high molecular weight polymer capable of being dissolved in or getting swollen by an alkaline water.

Examples of such organic high molecular weight polymers are addition polymers each having carboxyl groups on the side chains such as those disclosed in, for instance, J.P. KOKAI Nos. Sho 59-44615, Sho 54-92723, Sho 59-53836 and Sho 59-71048 and J.P. KOKOKU Nos. Sho 54-34327, Sho 58-12577 and Sho 54-25957 and more specifically, methacrylic acid copolymers, acrylic acid copolymers, itaconic acid copolymers, crotonic acid copolymers, maleic acid copolymers and partially esterified maleic acid copolymers.

Examples of binder polymers further include acidic cellulose derivatives likewise having carboxyl groups on the side chains. In addition to the foregoing, also useful are, for instance, addition polymers having hydroxyl groups to which cyclic acid anhydrides are added. Among these, particularly preferred and suitably used herein are [benzyl (meth)acrylate/(meth)acrylic acid/optional other addition polymerizable vinyl monomer] copolymers and [allyl (meth)acrylate/(meth)acrylic acid/optional other addition polymerizable vinyl monomer] copolymers. Also useful are, for instance, water-soluble organic polymers such as polyvinyl pyrrolidones and polyethylene oxides in addition to the foregoing ones. Moreover, other binder polymers such as alcohol-soluble polyamides and polyethers of 2,2-bis-(4-hydroxyphenyl)-propane with epichlorohydrin are useful for the improvement of the strength of a film obtained after curing.

Examples of other binder polymers useful for the purpose of the present invention are polyurethane resins such as those disclosed in J.P. KOKOKU Nos. Hei 7-120040, Hei 7-120041, Hei 7-120042 and Hei 8-12424 and J.P. KOKAI Nos. Sho 63-287944, Sho 63-287947, Hei 1-271741 and Hei 11-352691.

Radical-reactive groups may be introduced into these high molecular weight polymers to thus improve the strength of the film obtained after curing the polymer. Examples of such reactive groups are ethylenically unsaturated bond-containing groups, amino groups and epoxy groups as functional groups capable of undergoing addition polymerization reactions; mercapto groups, thiol groups, halogen atoms, triazine structures and onium salt structures as functional groups capable of being converted into radicals through irradiation with light rays; and polar groups such as carboxyl groups and imido groups. Among the foregoing functional groups capable of undergoing addition polymerization reactions, particularly preferred are ethylenically unsaturated bond-containing groups such as acryl, methacryl, allyl and styryl groups, but suitably used herein also include, for instance, functional groups selected from the group consisting of amino groups, hydroxyl groups, phosphonate residues, phosphate residues, carbamoyl groups, isocyanate groups, ureido groups, ureylene groups, sulfonate residues and ammonio groups.

The binder polymer should have an appropriate molecular weight and an acid value for maintaining the developing properties of the image-recording layer and therefore, the binder polymer effectively used herein has a weight average molecular weight ranging from 5000 to 300,000 and an acid value ranging from 20 to 200.

These binder polymers may be incorporated into the composition for preparing an image-recording layer in any amount, but the content thereof preferably ranges from 10 to 90% by weight and more preferably 30 to 80% by weight. In other words, the binder polymer is preferably used in an amount of not more than 90% by weight since it permits the achievement of excellent results such as high strength of the resulting images. Moreover, the weight ratio of the ethylenically unsaturated bond-containing compound to the binder polymer preferably ranges from 1/9 to 9/1, more preferably 2/8 to 8/2 and most preferably 3/7 to 7/3.

[Other Components]

Moreover, it is desirable to add, to the image-recording layer of the foregoing image-forming material, a small amount of heat polymerization-inhibitory agent in order to inhibit any unnecessary heat polymerization of the polymerizable ethylenically unsaturated bond-containing compound during the preparation or storage of the composition (hereunder also referred to as "light-sensitive composition") for forming the image-recording layer, in addition to the foregoing basic components. Examples of such heat polymerization-inhibitory agents suitably used herein are hydroquinone, p-methoxy-phenol, di-t-butyl-p-cresol, pyrogallol, t-butyl-catechol, benzoquinone, 4,4'-thiobis-(3-methyl-6-t-butylphenol), 2,2'-methylenebis-(4-methyl-6-t-butylphenol), cerous salt of N-nitrosophenyl hydroxylamine and aluminum salt of N-nitrosophenyl hydroxyl-amine. The amount of the heat polymerization inhibitory agent to be added preferably ranges from about 0.01% to about 5% on the basis of the weight of the solid content of the image-recording layer. In addition, it is also possible to optionally add, for instance, a higher fatty acid derivative such as behenic acid or a behenic acid amide to the image-recording layer in such a manner that the additive is localized in the surface of the image-recording layer during the drying process after the application of the layer for the inhibition of the occurrence of any polymerization due to oxygen gas. The added amount of the higher fatty acid derivative preferably ranges from about 0.5% to about 10% on the basis of the total weight of the solid content of the image-recording layer.

Further, a coloring agent may be added to the image-recording layer for pigmenting the recording layer. Examples of such coloring agents are pigments such as phthalocyanine pigments (for instance, C.I. Pigment Blue 15:3, 15:4, 15:6), azo pigments, carbon black and titanium oxides; Ethyl Violet, Crystal Violet; azo dyes, anthraquinone dyes and cyanine dyes. The amount of these pigments and/or dyes to be added preferably ranges from about 0.5% to about 20% on the basis of the total weight of the composition for the image-recording layer. Moreover, it is also possible to incorporate, into the image-recording layer, additives such as inorganic fillers and/or plasticizers such as di-octyl phthalate, dimethyl phthalate and tricresyl phosphate in order to improve physical properties of the resulting cured film. The amount of these additives to be added is preferably not more than 10% of the total composition for the image-recording layer.

[Method for Preparing Image-Forming Material]

In the present invention, an image-recording layer-forming composition used for preparing an image-forming material is dissolved in a variety of organic solvents and then applied onto the surface of an aluminum substrate as will be detailed later. Examples of such solvents usable herein are acetone, methyl ethyl ketone, cyclohexane, ethyl acetate, ethylene dichloride, tetrahydrofuran, toluene, ethylene glycol monomethyl ether, ethylene glycol mono-ethyl ether, ethylene glycol dimethyl ether, propylene glycol monomethyl ether, propylene glycol mono-ethyl ether, acetyl acetone, cyclohexanone, diacetone alcohol, ethylene glycol monomethyl ether acetate, ethylene glycol ethyl ether acetate, ethylene glycol mono-isopropyl ether, ethylene glycol mono-butyl ether acetate, 3-methoxy propanol, methoxy-methoxy ethanol, diethylene glycol monomethyl ether, diethylene glycol mono-ethyl ether, diethylene glycol dimethyl ether, diethylene glycol di-ethyl ether, propylene glycol monomethyl ether acetate, propylene glycol mono-ethyl ether acetate, 3-methoxypropyl acetate, N,N-dimethyl formamide, dimethyl sulfoxide, γ-butyrolactone, methyl lactate and ethyl lactate. These organic solvents may be used alone or as a mixture thereof The concentration of the solid contents of the coating solution suitably ranges from 1 to 50% by weight.

A surfactant may be incorporated into the image-recording layer used in the invention for the improvement of the quality of the coated layer. The coated amount of the image-recording layer suitably ranges from about 0.1 g/m$^2$ to about 10 g/m$^2$, preferably 0.3 g/m$^2$ to 5 g/m$^2$ and more preferably 0.5 g/m$^2$ to 3 g/m$^2$ as expressed in terms of the amount determined after drying.

[Protective Layer]

In general, when exposing an image-forming material to light rays in the air, it is preferred to apply a protective layer onto the image-recording layer of the material. The protective layer serves to prevent any contamination of the image-recording layer with low molecular weight compounds such as oxygen and/or basic substances present in the air, which may inhibit the image-forming reaction certainly occurring within the image-recording layer and initiated through the irradiation with or the exposure to light rays and the layer would thus permit the exposure of the layer in the air. For this reason, the protective layer should desirably have such properties as a low permeability to low molecular weight compounds such as oxygen, a substantially high transparency to the light rays used for the exposure, excellent adhesion to the image-recording layer and an ability of being easily peeled off in the developing step after the exposure. Various devices have been considered to obtain such a protective layer and details thereof are disclosed in, for instance, U.S. Pat. No. 3,458,311 and J.P. KOKAI Sho 55-49729.

The material used for preparing such a protective layer may, for instance, be preferably a water-soluble high molecular weight compound relatively excellent in the crystallizability and specific examples thereof known in the art include water-soluble polymers such as polyvinyl alcohol, polyvinyl pyrrolidone, acidic cellulose materials, gelatin, gum Arabic, and polyacrylic acid. Among these water-soluble polymers, preferably used herein are those comprising polyvinyl alcohols as main components since they can provide most excellent results from the viewpoint of the basic characteristics such as the oxygen barrier properties and its easy removability during the development. The vinyl alcohol units of the polyvinyl alcohol used for forming a protective layer may partially be substituted with ester, ether and acetal groups inasmuch as the polyvinyl alcohol still has unsubstituted vinyl alcohol units sufficient for ensuring the desired oxygen barrier properties and water-solubility. Similarly, it may comprise a minor amount of other copolymerizable components. An example of such a polyvinyl alcohol used herein is one, 71 to 100% of which is hydrolyzed and which has a molecular weight ranging from 300 to 2400.

Specific examples thereof are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are commercially available from Kuraray Co., Ltd.

In this respect, various factors such as components of the protective layer (selection of PVA, use of additives), and the amount to be coated are appropriately be selected while taking into consideration the desired effects such as the fogging properties, the adhesion of the protective layer to the image-recording layer, the resistance to scratching marks in addition to the oxygen barrier properties and easy removability during development. In this connection, it is common that the higher the rate of hydrolyzed PVA (the higher the content of unsubstituted vinyl alcohol units present in the protective layer) and the thicker the protective layer, the higher the resulting oxygen barrier properties and the more advantageous the sensitivity of the image-recording layer. If the oxygen barrier properties thereof are extremely high, however, various problems arise such that the image-recording layer may undergo undesirable polymerization reaction during the preparation of the image-forming material and/or the storage thereof prior to the practical use, and that there would be observed undesirable fogging and thickening of printing images. Further, the adhesion to the image area and the resistance to scratch marks are likewise quite important when handling the resulting printing plate. More specifically, if a hydrophilic layer of a water-soluble polymer is deposited on a lipophilic polymerized layer, the former may easily be peeled off from the latter because of insufficient adhesion between them and the peeled portions in turn become a cause of defects due to the polymerization-inhibitory effect of oxygen such as insufficient curing of the film.

Accordingly, there have been proposed a variety of means for the improvement of the adhesion between these two layers. For instance, U.S. Pat. Nos. 292,501 and 44,563 disclose that sufficient adhesion can be ensured between these two layer by incorporating, for instance, an acrylic emulsion or a water-insoluble vinyl pyrrolidone-vinyl acetate copolymer into a hydrophilic polymer mainly comprising polyvinyl alcohol in an amount ranging from 5 to 80% by weight and then applying the resulting mixture onto the surface of a polymerizable layer. In the present invention, these known techniques can be used for the preparation of the protective layer. The details of the methods for preparing such a protective layer are disclosed in, for instance, U.S. Pat. No. 3,458,311 and J.P. KOKAI Sho 55-49729.

Moreover, other functions can be imparted to the protective layer. For instance, the protective layer may comprise a coloring agent (such as a water-soluble dye) which is excellent in the transparency to the light rays of 350 to 450 nm used in the exposure step and which can efficiently absorb light rays of not less than 500 nm and thus, the safe light properties of the image-forming material can further be improved without being accompanied by any reduction of the sensitivity thereof.

[Substrate]

Then the substrate as a material for preparing an image-forming material will be detailed below. The substrate usable herein is not restricted to any specific one, but aluminum substrates are preferred. The aluminum substrate herein used may be a dimensionally stable aluminum or aluminum alloy (such as an alloy with silicon, copper, manganese, magnesium, chromium, zinc, lead bismuth and/or nickel) plate, or a plastic film or paper, which is laminated with an aluminum or aluminum alloy foil or on which such a metal is vapor-deposited and the substrate in general has a thickness ranges from about 0.05 to 1 mm. Moreover, also usable herein include, for instance, composite sheets disclosed in J.P. KOKAI Sho 48-18327.

Preferably, the aluminum substrate is, if necessary, subjected to a surface treatment as will be described later.

(Surface Graining Treatment)

The surface graining treatment may be, for instance, mechanical graining, chemical etching and electrolytic graining treatments such as those disclosed in J.P. KOKAI Sho 48-18327. Examples of such surface graining methods usable herein further include an electrochemical surface graining method which comprises electrochemically surface-graining an aluminum plate in an electrolyte containing hydrochloric acid or nitric acid, and mechanical surface graining methods such as a wire brush-graining method in which the surface of an aluminum plate is scratched with metallic wires; a ball graining method in which the surface of an aluminum plate is grained using abrasive balls and an abrasive grains; and a brush-graining method which comprises graining the surface of an aluminum plate with a nylon brush and an abrasive and these surface graining methods may be used alone or in combination. Among these, preferably used herein are methods in which the surface of an aluminum plate is chemically surface-grained in an electrolyte comprising hydrochloric acid or nitric acid since they permit the achievement of desired surface roughness useful in the present invention. In this surface graining treatment, the current density used preferably ranges from 100 to 400 C/dm$^2$. More specifically, the aluminum substrate is preferably electrolyzed, in an electrolyte containing 0.1 to 50% hydrochloric acid or nitric acid, at a temperature ranging from 20 to 100° C. and a current density ranging from 100 to 400 C/dm$^2$, for one second to 30 minutes.

The aluminum substrate thus surface-grained is then subjected to a chemical etching treatment with an acid or an alkali. When using an acid as an etching agent, it takes a long period of time to destroy fine structures of the surface and the application of the technique to the method of the invention is quite disadvantageous from the industrial standpoint, but this problem can be solved by the use of an alkali as an etching agent. Examples of such alkaline agents suitably used in the present invention are sodium hydroxide, sodium carbonate, sodium aluminate, sodium metasilicate, sodium phosphate, potassium hydroxide and lithium hydroxide. The concentration of an alkali ranges from 1 to 50% and the temperature ranges from 20 to 100° C., or the conditions for this etching treatment are preferably selected such that the amount of Al dissolved during the etching falls within the range of from 5 to 20 g/m$^3$. After the etching, the aluminum substrate is washed with an acid to remove the contaminants (smut) remaining on the surface. Acids used in this washing treatment are, for instance, nitric acid, sulfuric acid, phosphoric acid, chromic acid, hydrofluoric acid and hydrogen borofluoride. In particular, examples of methods for desmutting an aluminum plate after the electrochemical surface roughening treatment thereof preferably used herein are one comprising the step of bringing the aluminum substrate into contact with a 15 to 65% by weight sulfuric acid solution maintained at a temperature ranging from 50 to 90° C. as disclosed in J.P. KOKAI Sho 53-12739 and an alkali etching method such as that disclosed in J.P.

KOKOKU Sho 48-28123. The Al substrate effectively used in the present invention has surface roughness (Ra) ranging from 0.3 to 0.7 μm.

(Anodization Treatment)

Then the aluminum substrate thus treated is preferably subjected to an anodization treatment. Such an anodization treatment may be carried out according to the method conventionally known in this art. Specifically, a direct or alternating current is passed through the aluminum substrate in an aqueous or non-aqueous solution containing at least one member selected from the group consisting of sulfuric acid, phosphoric acid, chromic acid oxalic acid, sulfamic acid and benzene sulfonic acid to thus form an anodized layer on the surface of the aluminum substrate. The conditions for the anodization treatment may vary variously depending on the kind of electrolyte used and cannot unconditionally be determined, but the anodization is in general carried out under the following preferred conditions: an electrolyte concentration ranging from 1 to 80%; an electrolyte temperature ranging from 5 to 70° C.; a current density ranging from 0.5 to 60 A/dm$^2$; a voltage ranging from 1 to 100 V; and an electrolyzation time ranging from 10 to 100 seconds.

Among these anodization treatments, preferably used in the invention are, for instance, the method disclosed in U.K. Patent No. 1,412,768 in which an aluminum plate is anodized at a high current density in a sulfuric acid solution and the method disclosed in U.S. Pat. No. 3,511,661 in which an aluminum plate is anodized using a phosphoric acid solution as an electrolytic bath. In the present invention, the amount of the anodized layer thus formed ranges from 1 to 10 g/m$^2$. If the amount thereof is not less than 1 g/m$^2$, the resulting printing plate is hardly damaged and if it is not more than 10 g/m$^2$, it is not necessary to use any excess electricity for the production of an aluminum substrate and this would accordingly permit the reduction of cost required for the production of such a substrate. Preferably, the amount of the anodized layer ranges from 1.5 to 7 g/m$^2$ and more preferably 2 to 5 g/m$^2$.

In the present invention, the aluminum substrate may further be subjected to a sealing treatment after the foregoing surface-graining and anodization treatments. Such a sealing treatment may be carried out, for instance, by immersing the aluminum substrate in hot water or a hot aqueous solution of an inorganic or organic salt or by treating the substrate in a steam bath. Moreover, the aluminum substrate of the present invention subjected to a silicate treatment using a metal silicate or a surface treatment other than such a silicate treatment, for instance, a treatment in which the aluminum substrate is immersed in an aqueous solution of, for instance, potassium fluorozirconate or a phosphoric acid salt.

The image-forming material of the present invention is prepared by forming an image-recording layer consisting of the foregoing photopolymerizable composition on the aluminum substrate which has been surface-treated according to the methods discussed above, but an organic or inorganic intermediate layer may, if necessary, be formed on the aluminum substrate prior to the application of the image-recording layer.

[Intermediate Layer]

The image-forming material of the present invention may optionally be provided with an intermediate layer between the substrate and the image-recording layer for the improvement of the adhesion between them and resistance to contamination. Specific examples of such intermediate layers are those disclosed in, for instance, J.P. KOKOKU Sho 50-7481; J.P. KOKAI Nos. Sho 54-72104, Sho 59-101651, Sho 60-149491, Sho 60-232998, Hei 3-56177, Hei 4-282637, Hei 5-16558, Hei 5-246171, Hei 7-159983, Hei 7-314937, Hei 8-202025, Hei 8-320551, Hei 9-34104, Hei 9-236911, Hei 9-269593, Hei 10-69092, Hei 10-115931, Hei 10-161317, Hei 10-260536, Hei 10-282682, Hei 11-84674, Hei 10-69092, Hei 10-115931, Hei 11-38635, Hei 11-38629, Hei 10-282645, Hei 10-301262, Hei 11-24277, Hei 11-109641, Hei 10-319600, Hei 11-84674, Hei 11-327152, 2000-10292, 2000-235254, 2000-352824 and 2001-209170; and Japanese Patent Application Serial No. Hei 11-284091.

[Imagewise Exposure and Developing Treatment]

The image-forming material used in the present invention is imagewise exposed to conventionally known actinic light rays such as those derived from a carbon arc lamp, a high pressure mercury lamp, a xenon lamp, a metal halide lamp, a fluorescent lamp, a tungsten lamp, a halogen lamp, a helium-cadmium laser, an argon ion laser, an FD•YAG laser, a helium-neon laser and a semiconductor laser (350 nm to 600 nm) and then developed to thus form desired images on he surface of the aluminum substrate. After the imagewise exposure, the image-forming material may be subjected to a heat-treatment at a temperature ranging from 50 to 150° C. for one second to 5 minutes for the purpose of improving the curing rate of the polymerizable image-recording layer prior to the developing step.

A protective layer usually having oxygen barrier properties is in general formed on the image-recording layer used in the invention as has been described above. In this respect, there has been known a method for simultaneously removing the protective layer and the un-exposed areas on the image-recording layer using a developer used in the present invention or a method comprising the step of first removing the protective layer using water or warmed water and then removing the un-exposed areas on the image-recording layer through development. The water or warmed water may comprise additives such as a preservative such as that disclosed in J.P. KOKAI Hei 10-10754 and an organic solvent such as that disclosed in J.P. KOKAI Hei 8-278636.

In the present invention, the image-forming material can be developed according to the usual method and more specifically, by immersing the imagewise exposed image-forming material in a developer at a temperature ranging from 0 to 60° C., preferably 15 to 40° C. while rubbing the surface of the material with a brush.

In addition, when the image-forming material is developed using an automatic developing machine, the developer used is gradually fatigued in proportion to the throughput and therefore, the developing ability of the developer may be restored using a replenisher or a fresh developer. The image-forming material thus developed is subjected to various post-treatments with, for instance, washing water, a rinsing liquid containing, for instance, a surfactant and/or a desensitizing liquid containing, for instance, gum Arabic and/or a starch derivative, as disclosed in, for instance, J.P. KOKAI Nos. Sho 54-8002, Sho 55-115045 and Sho 59-58431. In the present invention, various combinations of the foregoing treatments may be used in the post-treatment of the image-forming material. Further, if the image-forming material is used as an original plate for a lithographic printing plate, the printing plate obtained through the foregoing treatments may further be subjected to a post-exposure treatment and/or a heat treatment such as a burning treatment as disclosed in J.P. KOKAI 2000-89478 to thus improve the printing durability of the printing plate. The lithographic printing plate thus obtained is set on an offset printing press to thus give a large number of printed matters.

In the present invention, if the image-forming material is used as an original plate for a lithographic printing plate, the lithographic printing plate obtained after the foregoing treatments is set on an offset printing press to thus give a large number of printed matters. In this respect, a plat cleaner may be used for the removal of any contaminant present on the printing plate prior to the initiation of the printing operations. Such a plate cleaner may be a conventionally known one used for cleaning PS plates and specific examples thereof include CL-1, CL-2, CP, CN-4, CN, CG-1, PC-1, SR and IC (they are all available from Fuji Photo Film Co., Ltd.).

EXAMPLES

The present invention will hereunder be described in more detail with reference to -the following Examples, but the scope of the present invention is not restricted to these specific Examples at all.

First of all, original plates for making lithographic printing plates (1) to (4) as image-forming materials were prepared according to the following procedures.

[Original Plate (1) for Lithographic Printing Plate]

A 1S aluminum plate having a thickness of 0.3 mm was sufficiently washed with water and then immersed in a 10% sodium hydroxide solution at 70° C. for 60 seconds for etching, followed by washing with running water, neutralization and washing with a 20% nitric acid solution and subsequent washing with water. The aluminum plate was then subjected to an electrolytic surface-roughening treatment in a 1.5% aqueous nitric acid solution, at the quantity of electricity at the anode time of 270 coulomb/dm$^2$, using a sinusoidal alternating waved current under the condition of $V_A$=12.7 V. At this stage, the surface roughness of the resulting aluminum plate was determined and it was found to be 0.30 μm (as expressed in terms of Ra). Subsequently, the plate was immersed in a 30% aqueous solution of sulfuric acid to thus carry out the desmutting thereof at 40° C. for 2 minutes and then anodized at a current density of 5 A/dm$^2$, at 33° C. for 50 seconds in a 20% aqueous solution of sulfuric acid while a cathode was positioned on the grained surface of the plate, and as a result, the thickness of the anodized layer was found to be 2.7 g/m$^2$.

A coating solution for forming an intermediate layer having the following composition was applied onto the aluminum plate thus treated such that the amount of the solution weighed after drying was equal to 2 mg/m$^2$ and then dried at 100° C. for 3 minutes.

Coating Liquid for Forming Intermediate Layer

The following components were stirred and mixed together in amounts specified below. After about 5 minutes, there was observed generation of heat. The components were reacted for 60 minutes and then 20,000 g of methanol was added to thus give a coating liquid for forming an intermediate layer:

| | |
|---|---|
| Methanol | 100 g |
| DDP-8 (Phosphate compound available from Nikko Chemicals, Inc.) | 15 g |
| Water | 10 g |
| Phosphoric acid | 5 g |
| Tetra-ethoxy silane | 50 g |
| 3-Methacryloxy-propyl tri-ethoxy silane | 50 g |

The following photopolymerizable composition 1 having the composition specified below was applied onto the undercoating layer in such a manner that the coated amount thereof weighed after drying was equal to 1.5 g/m$^2$ and then dried at 100° C. for 90 seconds to thus form a light-sensitive layer.

| Photopolymerizable Composition 1 | |
|---|---|
| Ethylenically unsaturated bond-containing compound (A1) | 1.8 g |
| Binder polymer (B1) | 1.5 g |
| Sensitizing dyestuff (C1) | 0.15 g |
| Photopolymerization initiator (D1) | 0.2 g |
| β-Phthalocyanine (F1) dispersion | 0.2 g |
| Fluorine atom-containing surfactant; Megafac F177 (available from DIC*) | 0.03 g |
| Methyl ethyl ketone | 10 g |
| Propylene glycol monomethyl ether acetate | 10 g |

*Dainippon Ink and Chemicals, Inc.

A1

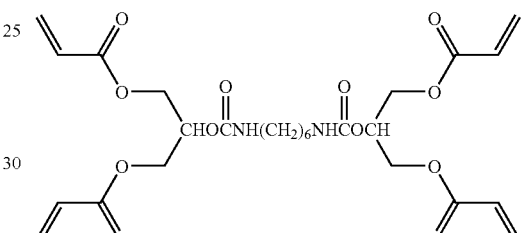

B1

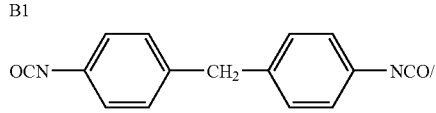

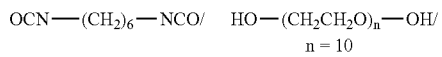

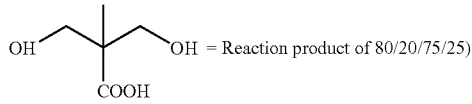

C1

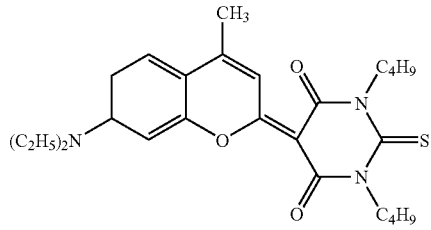

D1

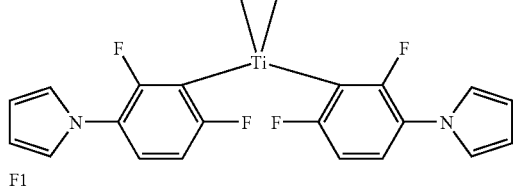

F1

-continued

Photopolymerizable Composition 1

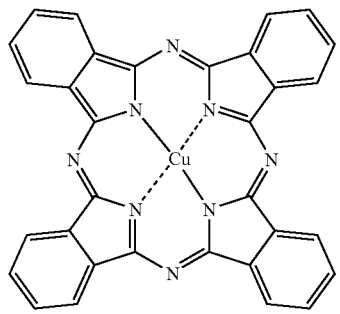

A 3% by weight aqueous solution of polyvinyl alcohol (degree of saponification: 98 mole %; degree of polymerization: 500) was applied onto the photopolymerizable light-sensitive layer thus formed such that the coated amount of the aqueous solution was 2.5 g/m² as expressed in terms of the amount determined after drying and then dried at 100° C. for 90 seconds to thus form an original plate (1) for preparing a lithographic printing plate.

[Original Plate (2) for Preparing Lithographic Printing Plate]

The same procedures used for preparing the original plate (1) for forming a lithographic printing plate were repeated except for using a photopolymerizable composition 2 which was identical to the photopolymerizable composition 1 except that C-2 (specified later) was substituted for C-1 used in the composition 1, to thus prepare an original plate (2) for preparing a lithographic printing plate.

[Original Plate (3) for Preparing Lithographic Printing Plate]

The same procedures used for preparing the original plate (2) for forming a lithographic printing plate were repeated except for using a photopolymerizable composition 3 which was identical to the photopolymerizable composition 2 except that 0.1 g of a triazine compound (I)-1 was further added to the composition 2, to thus prepare an original plate (3) for preparing a lithographic printing plate.

[Original Plate (4) for Preparing Lithographic Printing Plate]

A 1S aluminum plate having a thickness of 0.3 mm was surface-grained using a No. 8 nylon brush and an aqueous suspension of 800 mesh pumice stone and then sufficiently washed with water. The aluminum plate was then immersed in a 10% sodium hydroxide solution at 70° C. for 60 seconds for etching, followed by washing with running water, neutralization and washing with a 20% nitric acid solution and subsequent washing with water. The aluminum plate was then subjected to an electrolytic surface-roughening treatment in a 1% aqueous nitric acid solution, at the quantity of electricity at the anode time of 300 coulomb/dm², using a sinusoidal alternating waved current under the condition of $V_A=12.7$ V. At this stage, the surface roughness of the resulting aluminum plate was determined and it was found to be 0.45 μm (as expressed in terms of Ra). Subsequently, the plate was immersed in a 30% aqueous solution of sulfuric acid to thus carry out the desmutting thereof at 55° C. for 2 minutes and then anodized at a current density of 5 A/dm² and at 33° C. for 50 seconds in a 20% aqueous solution of sulfuric acid while a cathode was positioned on the grained surface of the plate and as a result, the thickness of the anodized layer was found to be 2.7 g/m².

A liquid containing a methyl methacrylate/ethyl acrylate/sodium 2-acrylamido-2-methyl-propane sulfonate copolymer (molar ratio: 60/25/15; molecular weight Mn=30,000) dissolved in water/methanol (5 g/95 g) mixed solvent was coated on the surface of the aluminum plate on which the foregoing anodized layer had been formed in such a manner that the amount of the liquid determined after drying was equal to 3 mg/m² and then dried at 80° C. for 30 seconds to thus form an intermediate layer and the resulting aluminum plate was used as an aluminum substrate.

The following photopolymerizable composition 4 having the composition specified below was applied onto the intermediate layer in such a manner that the coated amount thereof weighed after drying was equal to 1.5 g/m² and then dried at 100° C. for 90 seconds to thus form a light-sensitive layer.

| Photopolymerizable Composition 4 | |
|---|---|
| Ethylenically unsaturated bond-containing compound (A2) | 1.5 g |
| Binder polymer (B2) | 1.8 g |
| Sensitizing dyestuff (C2) | 0.1 g |
| The foregoing photopolymerization initiator (D1) | 0.2 g |
| β-Phthalocyanine (F1) dispersion | 0.2 g |
| Fluorine atom-containing surfactant; Megafac F177 (available from DIC*) | 0.03 g |
| Methyl ethyl ketone | 10 g |
| Propylene glycol monomethyl ether acetate | 10 g |

*Dainippon Ink and Chemicals, Inc.

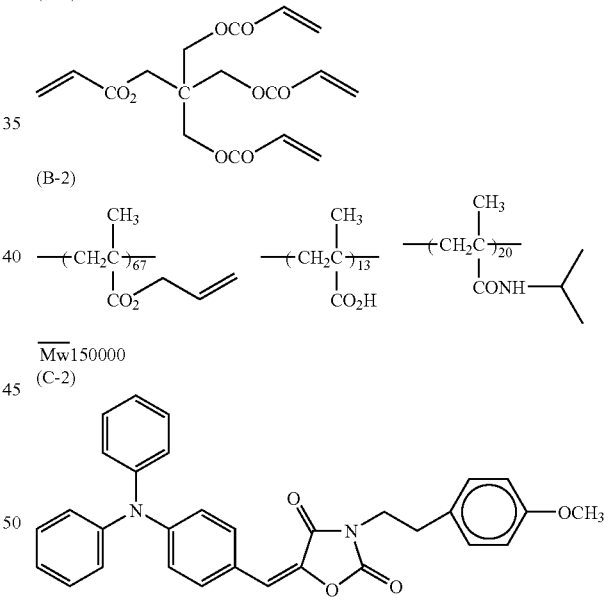

A 3% by weight aqueous solution of polyvinyl alcohol (degree of saponification: 98 mole %; degree of polymerization: 500) was applied onto the photopolymerizable light-sensitive layer thus formed such that the coated amount of the aqueous solution was 2.5 g/m² as expressed in terms of the amount determined after drying and then dried at 100° C. for 90 seconds to thus form an original plate (4) for preparing a lithographic printing plate.

Among these original plates for preparing lithographic printing plates, the original plate (1) obtained using the photopolymerizable composition 1 was imagewise exposed to light emitted from an FD•YAG laser (Plate Jet 4 available from CSI Company) and the original plates (2) to (4)

obtained using the photopolymerizable compositions 2 to 4 respectively were imagewise exposed to light emitted from a violet laser (Luxel Vx9600CTP available from Fuji Photo Film Co., Ltd.) under the conditions of 175 lines/in at 2400 dpi, while variously changing the exposure value.

The imagewise exposed original plates were then subjected to a standard treatment in an automatic developing machine (LP-850PII available from Fuji Photo Film Co., Ltd.) which comprised a developer having the composition specified below and a finishing gum liquid FP-2W (available from Fuji Photo Film Co., Ltd.).

Developer

The following ingredients were dissolved in water to thus prepare a developer:

| Carbonate | a mole/L |
| --- | --- |
| Hydrogen carbonate | b mole/L |
| Surfactant | c g/L |
| Additives | d g/L |
| Ethylenediamine-tetraacetic acid.4 Na salt (Chelating agent) | 2 g/L |

TABLE 1

| Developer No. | Alkaline agent 1, (mole/L) | Alkaline agent 2, (mole/L) | Alkaline agent 3, (mole/L) |
| --- | --- | --- | --- |
| 1 | $K_2CO_3$ (0.17) | $KHCO_3$ (0.038) | Not added |
| 2 | $K_2CO_3$ (0.3) | $KHCO_3$ (0.067) | Not added |
| 3 | $K_2CO_3$ (0.59) | $KHCO_3$ (0.13) | Not added |
| 4 | $Na_2CO_3$ (0.4) | $NaHCO_3$ (0.09) | Not added |
| 5 | $K_2CO_3$ (0.3) | $KHCO_3$ (0.067) | Not added |
| 6 | $K_2CO_3$ (0.3) | $KHCO_3$ (0.067) | Not added |
| 7 | $K_2CO_3$ (0.13) | $KHCO_3$ (0.029) | Not added |
| 8 | $K_2CO_3$ (0.13) | $KHCO_3$ (0.029) | Not added |
| 9 | $K_2CO_3$ (0.3) | $KHCO_3$ (0.067) | Not added |
| 10 | $K_2CO_3$ (0.3) | $KHCO_3$ (0.067) | Not added |
| 11 | $K_2CO_3$ (0.3) | $KHCO_3$ (0.067) | KOH (0.015) |
| 12 | $K_2CO_3$ (0.11) | $KHCO_3$ (0.13) | Not added |
| 13 | $K_2CO_3$ (0.08) | $KHCO_3$ (0.25) | Not added |
| 14* | $K_2CO_3$ (0.13) | $KHCO_3$ (0.029) | Not added |
| 15* | $K_2CO_3$ (0.65) | $KHCO_3$ (0.145) | Not added |
| 16* | $K_2CO_3$ (0.3) | $KHCO_3$ (0.067) | Not added |
| 17* | $K_2CO_3$ (0.3) | $KHCO_3$ (0.067) | Not added |
| 18* | KOH (0.1) | Not added | Not added |
| 19* | KOH (0.0001) | Not added | Not added |

| Developer No. | Surfactant, (wt %) | Additive, (g/L) | pH at 25° C. | Conductivity at 25° C., (mS) |
| --- | --- | --- | --- | --- |
| 1 | Y-1 (5) | Not added | 10.5 | 31 |
| 2 | Y-1 (5) | Not added | 10.5 | 52.1 |
| 3 | Y-1 (5) | Not added | 10.5 | 95.4 |
| 4 | Y-1 (5) | Not added | 10.5 | 55.3 |
| 5 | Y-1 (2) | Not added | 10.5 | 52 |
| 6 | Y-1 (8) | Not added | 10.5 | 52.5 |
| 7 | Y-1 (5) | Potassium citrate (12) | 10.5 | 31.6 |
| 8 | Y-1 (5) | Sodium chloride (7) | 10.5 | 34.2 |
| 9 | Y-2 (5) | Not added | 10.5 | 31.5 |
| 10 | Y-13 (5) | Not added | 10.5 | 31.4 |
| 11 | Y-1 (5) | Not added | 11.4 | 57.1 |
| 12 | Y-1 (5) | Not added | 9.8 | 46.2 |
| 13 | Y-1 (5) | Not added | 9.1 | 39.1 |
| 14* | Y-1 (5) | Not added | 10.5 | 25.3 |
| 15* | Y-1 (5) | Not added | 10.5 | 105 |
| 16* | Y-1 (0.5) | Not added | 10.5 | 52.1 |
| 17* | Y-1 (11) | Not added | 10.5 | 52.1 |
| 18* | Y-1 (5) | Not added | 13 | 32 |
| 19* | Y-1 (5) | Not added | 10.5 | 3.5 |

*Comparative developer.

[Evaluation]

As an indication of the developing ability evaluation, each imagewise exposed original plate was inspected for the speed (rate) of development of the non-image area with an alkaline developer and further it was likewise inspected for the rate of penetration of each alkaline developer into the image-recording layer as an indication of the printing durability of the resulting printing plate.

The following are the details of the methods for determining "the rate of development of non-image areas with an alkaline developer" and "the rate of penetration of each alkaline developer into the image-recording layer", used in the present invention.

Determination of Rate of Development of Non-Image Area with Alkaline Developer

The term "the rate of development of non-image areas with an alkaline developer" herein used means the value obtained by dividing the thickness (m) of the image-recording layer (non-image area) by the time (sec) required for developing (or removing) the same. The method for determining the developing speed used in the present invention comprises, as shown in FIG. 1, immersing a material which comprises an aluminum substrate provided thereon with an un-exposed image-recording layer in an alkaline developer (30° C.) whose physical properties fall within the predetermined ranges, and then examining the dissolution behavior of the image-recording layer using a DRM interference wave (fringe)-measuring device. FIG. 1 is a schematic diagram showing such a DRM interference wave-measuring device for determining the dissolution behavior of the image-recording layer. In the present invention, any film thickness change was detected through the interference using light rays of 640 nm. In case where the development of the layer is one started from the surface of the image-recording layer without being accompanied by any swelling, the film thickness is gradually reduced with the elapse of time to thus provide interference fringes in proportion to the thickness of the image-recording layer. In case of the dissolution accompanied by swelling, the film thickness may vary by the penetration of a developer into the layer and therefore, any distinct interference fringe cannot be obtained.

The measurement was continued under such conditions to thus determine the time (s) (the time required for complete development) required for completely removing the image-recording layer and for making the film thickness zero and the developing speed (rate of development) can be calculated from the time (s) and the film thickness (μm) of the image-recording layer according to the following equation. The results obtained are judged as follows: The higher the rate of development, the easier the removal of the film with the developer and the higher the developing ability of the developer.

Developing Speed (of Un-Exposed Area)=[Thickness of Image-Recording Layer (μm)]/[Time (sec) Required for Complete Development]

To ensure the correspondence to the actual performance, the resulting printing plate was subjected to a test for examining the developing ability (see the section concerning "Evaluation of Developing Ability" given later).

Determination of "Rate of Penetration of Alkaline Developer into Image-Recording Layer"

In addition, the term "the rate of penetration of an alkaline developer into the image-recording layer" herein used means a value indicating the rate of variation of the electrostatic capacity (F) observed when immersing, in a developer, a material obtained by applying the foregoing image-recording layer onto a conductive substrate.

Figure 2:
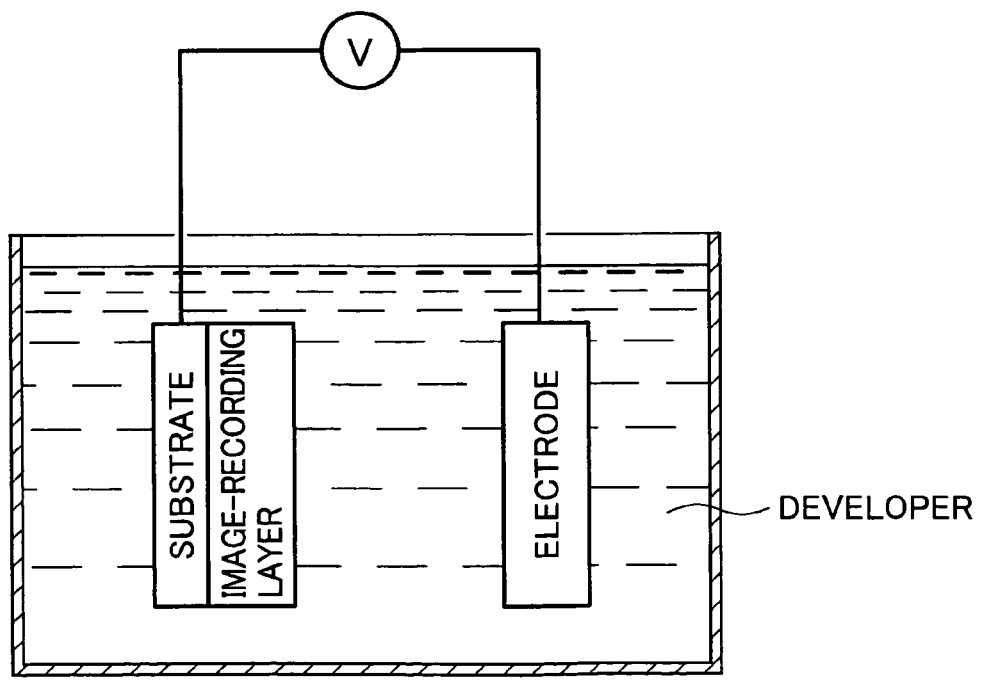
FIG. 2 is a schematic block diagram illustrating an example of a method for determining the electrostatic capacity used for the evaluation of the ability of a developer penetrating into an image-recording layer.

As shown in FIG. 2, the method for determining the electrostatic capacity (F) as a criterion for the permeability in the present invention comprises, for instance, immersing, in an alkaline developer (28° C.), an aluminum substrate serving as an electrode and provided thereon with an image-recording layer which has been exposed (in case of the photopolymerizable composition 1, the layer is exposed at an exposure value of 0.25 mJ/cm² using an FD•YAG laser (Plate Jet 4 available from CSI Company); and in case of the photopolymerizable compositions 2 and 3, the layer is exposed at an exposure value of 0.05 mJ/cm² using a violet laser (Luxel Vx9600CTP available from Fuji Photo Film Co., Ltd.) and then cured, connecting the aluminum substrate to a leading wire, while using a usual electrode as an opposite electrode and then applying an electric voltage between these electrodes. After the application of an electric voltage, the developer penetrates into the image-recording layer with the lapse of immersion time and finally arrives at the interface between the recording layer and the substrate to thus cause a change in the electrostatic capacity.

Accordingly, the rate of penetration of an alkaline developer into the image-recording layer can be calculated from the time (s) required till the electrostatic capacity undergo a change and the film thickness (μm) of the image-recording layer according to the following equation. In this respect, the results obtained are judged as follows: The smaller the rate of the developer penetration, the lower the permeability of the developer into the image-recording layer.

Rate of Developer Penetration (of Exposed Area)= [film thickness (μm) of the image-recording layer]/[Time (s) required till electrostatic capacity arrives at a constant level]

To ensure the correspondence to the actual performance, the resulting printing plate was set on a printing press so that the printing plate was inspected for the printing durability (see the section concerning "Evaluation of Printing Durability" given later).

In respect of physical properties of the original plate for preparing a lithographic printing plate according to the present invention, the rate of development of the un-exposed area with an alkaline developer is preferably not less than 80 nm/sec, more preferably 80 to 400 nm/sec and further preferably 90 to 200 nm/sec. Moreover, the rate of penetration of an alkaline developer into the exposed area is preferably not more than 100 nF/sec, more preferably not more than 90 nF/sec and further preferably not more than 80 nF/sec.

(Evaluation of Developing Ability)

The actual developing ability of the non-image area was examined by developing the imagewise exposed image-forming material with a developer specified in the foregoing Table 1 at 28° C. for 18 seconds using LP-850PII available from Fuji Photo Film Co., Ltd.

(Evaluation of Printing Durability)

The original plates (1) to (3) for preparing lithographic printing plates were imagewise exposed to light emitted from an FD•YAG laser (Plate Jet 4 available from CSI Company) under the conditions of 175 lines/in at 2400 dpi and an exposure value of 0.25 mJ/cm², in case of the original plates obtained using the photopolymerizable composition 1 and to light emitted from a violet laser (Luxel Vx9600CTP available from Fuji Photo Film Co., Ltd.) under the conditions of 175 lines/in at 2400 dpi and an exposure value of 0.05 mJ/cm², in case of the original plates obtained using the photopolymerizable compositions 2 and 3, respectively.

After the imagewise exposure, the imagewise exposed original plates were washed with tap water to thus remove the protective layers and then developed using LP-850PII available from Fuji Photo Film Co., Ltd. at 28° C. for 18 seconds. In this respect, the finisher used herein was a 1:1 water/FP-2W (available from Fuji Photo Film Co., Ltd.).

Each of the resulting lithographic printing plates was set on a printing press LISRON available from KOMORI Corporation (K.K.) to thus determine the number of acceptable printed matters which was used as the indication for the printing durability.

(pH Reduction Due to Carbon Dioxide Gas Present in the Air)

Each developer was charged in the automatic developing machine: LP-850PII available from Fuji Photo Film Co., Ltd. and the developer was inspected for the pH change observed when allowing it to stand over one day without processing any original plate.

(Generation of Scum)

After developing 20 m² of the foregoing coated light-sensitive material in the foregoing developer (one liter), the developer was allowed to stand over one month and it was inspected for the generation of precipitated scum. The results obtained are likewise listed in the following Tables 2 to 5.

TABLE 2

Original Plate (1) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 1 | 120 | ○ | 40 | 16 | 0.1 | ○ |
| 2 | 145 | ○ | 45 | 16 | 0.1 | ○ |
| 3 | 150 | ○ | 60 | 15 | 0.1 | ○ |
| 4 | 145 | ○ | 60 | 16 | 0.1 | ○ |
| 5 | 100 | ○ | 35 | 17 | 0.1 | Δ |
| 6 | 145 | ○ | 60 | 15 | 0.1 | ○ |
| 7 | 120 | ○ | 45 | 16 | 0.1 | ○ |
| 8 | 120 | ○ | 50 | 16 | 0.1 | ○ |
| 9 | 135 | ○ | 50 | 16 | 0.1 | ○ |
| 10 | 95 | ○ | 55 | 16 | 0.1 | Δ |
| 11 | 150 | ○ | 75 | 15 | 0.15 | ○ |
| 12 | 110 | ○ | 45 | 16 | 0.1 | ○ |
| 13 | 95 | ○ | 45 | 16 | 0.1 | ○ |
| 14* | 80 | Remaining film | 35 | 16 | 0.1 | ○ |
| 15* | 75 | Remaining film | 35 | 16 | 0.1 | ○ |
| 16* | 25 | Remaining film | 30 | 17 | 0.1 | X |
| 17* | 145 | ○ | 120 | 13 | 0.1 | X |
| 18* | 150 | ○ | 170 | 13 | 0.4 | ○ |
| 19* | 10 | Remaining film | 35 | 17 | 0.6 | X |

*Comparative developer.

TABLE 3

Original Plate (2) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 1 | 125 | ○ | 35 | 17 | 0.1 | ○ |
| 2 | 145 | ○ | 40 | 16 | 0.1 | ○ |
| 3 | 155 | ○ | 60 | 16 | 0.1 | ○ |
| 4 | 145 | ○ | 55 | 16 | 0.1 | ○ |
| 5 | 105 | ○ | 30 | 17 | 0.1 | Δ |
| 6 | 150 | ○ | 60 | 15 | 0.1 | ○ |

TABLE 3-continued

Original Plate (2) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 7 | 125 | ○ | 40 | 16 | 0.1 | ○ |
| 8 | 120 | ○ | 45 | 17 | 0.1 | ○ |
| 9 | 130 | ○ | 50 | 16 | 0.1 | ○ |
| 10 | 100 | ○ | 50 | 16 | 0.1 | Δ |
| 11 | 155 | ○ | 70 | 15 | 0.15 | ○ |
| 12 | 115 | ○ | 45 | 17 | 0.1 | ○ |
| 13 | 100 | ○ | 40 | 16 | 0.1 | ○ |
| 14* | 85 | Remaining film | 30 | 16 | 0.1 | ○ |
| 15* | 70 | Remaining film | 30 | 16 | 0.1 | ○ |
| 16* | 30 | Remaining film | 30 | 18 | 0.1 | X |
| 17* | 140 | ○ | 115 | 13 | 0.1 | X |
| 18* | 155 | ○ | 170 | 13 | 0.4 | ○ |
| 19* | 15 | Remaining film | 30 | 17 | 0.6 | X |

*Comparative developer.

TABLE 4

Original Plate (3) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 1 | 125 | ○ | 35 | 17 | 0.1 | ○ |
| 2 | 145 | ○ | 40 | 16 | 0.1 | ○ |
| 3 | 155 | ○ | 60 | 16 | 0.1 | ○ |
| 4 | 145 | ○ | 55 | 16 | 0.1 | ○ |
| 5 | 105 | ○ | 30 | 17 | 0.1 | Δ |
| 6 | 150 | ○ | 60 | 15 | 0.1 | ○ |
| 7 | 125 | ○ | 40 | 16 | 0.1 | ○ |
| 8 | 120 | ○ | 45 | 17 | 0.1 | ○ |
| 9 | 130 | ○ | 50 | 16 | 0.1 | ○ |
| 10 | 100 | ○ | 50 | 16 | 0.1 | Δ |
| 11 | 155 | ○ | 70 | 15 | 0.15 | ○ |
| 12 | 115 | ○ | 45 | 17 | 0.1 | ○ |
| 13 | 100 | ○ | 40 | 16 | 0.1 | ○ |
| 14* | 85 | Remaining film | 30 | 16 | 0.1 | ○ |
| 15* | 70 | Remaining film | 30 | 16 | 0.1 | ○ |
| 16* | 30 | Remaining film | 30 | 18 | 0.1 | X |
| 17* | 140 | ○ | 115 | 13 | 0.1 | X |
| 18* | 155 | ○ | 170 | 13 | 0.4 | ○ |
| 19* | 15 | Remaining film | 30 | 17 | 0.6 | X |

*Comparative developer.

TABLE 5

Original Plate (4) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 1 | 115 | ○ | 45 | 13 | 0.1 | ○ |
| 2 | 140 | ○ | 45 | 13 | 0.1 | ○ |
| 3 | 150 | ○ | 65 | 12 | 0.1 | ○ |
| 4 | 140 | ○ | 65 | 13 | 0.1 | ○ |
| 5 | 100 | ○ | 35 | 14 | 0.1 | Δ |
| 6 | 145 | ○ | 65 | 12 | 0.1 | ○ |
| 7 | 120 | ○ | 50 | 13 | 0.1 | ○ |
| 8 | 115 | ○ | 55 | 13 | 0.1 | ○ |
| 9 | 135 | ○ | 55 | 13 | 0.1 | ○ |
| 10 | 95 | ○ | 60 | 13 | 0.1 | Δ |
| 11 | 145 | ○ | 75 | 12 | 0.15 | ○ |
| 12 | 110 | ○ | 50 | 13 | 0.1 | ○ |
| 13 | 90 | ○ | 50 | 13 | 0.1 | ○ |
| 14* | 80 | Remaining film | 40 | 13 | 0.1 | ○ |
| 13 | 90 | ○ | 50 | 13 | 0.1 | ○ |
| 14* | 80 | Remaining film | 40 | 13 | 0.1 | ○ |
| 15* | 75 | Remaining film | 40 | 13 | 0.1 | ○ |
| 16* | 25 | Remaining film | 35 | 14 | 0.1 | X |
| 17* | 145 | ○ | 125 | 10 | 0.1 | X |
| 18* | 150 | ○ | 175 | 10 | 0.4 | ○ |
| 19* | 10 | Remaining film | 40 | 14 | 0.6 | X |

*Comparative developer.

In the foregoing Tables 2 to 5, the open circle in the column entitled: "Ability of dev. (ability of development)" means that there is not observed any remaining film; the same symbol appearing in the column entitled: "Scum" (generation of scum) means that there is not observed any precipitate in the developer, the open triangle means that there is observed a trace amount of precipitates in the developer and the symbol: X means that there is observed the generation of a large amount of precipitates in the developer.

The results listed in the foregoing Tables 2 to 5 clearly indicate that the image-forming method of the present invention permits the achievement of a sufficient developing ability even at a relatively low pH (8.5 to 11.5) at which the image-forming material is not damaged so much and the preparation of a printing plate having good printing durability. Moreover, the developer undergoes only a slight change in pH and therefore, the developer would cause only a slight reduction in the developing activity due to the action of carbon dioxide gas. Further, there is observed almost no trouble due to the generation of scum (the developers 1 to 13 listed in Tables 2 to 5). On the other hand, when images were formed according to the method other than that of the present invention, there were observed various problems such that any sufficient developing ability cannot be ensured because of the presence of remaining films, that the resulting printing plate had low or insufficient printing durability and that scum generated during the development undergoes precipitation in the developing bath (the comparative developers 14 to 19 listed in Tables 2 to 5).

Next, original plates for making lithographic printing plates (5) to (8) as image-forming materials were prepared according to the following procedures.

[Original Plate (5) for Lithographic Printing Plate]

A 1S aluminum plate having a thickness of 0.3 mm was sufficiently washed with water and then immersed in a 10% sodium hydroxide solution at 70° C. for 60 seconds for etching, followed by washing with running water, neutralization and washing with a 20% nitric acid solution and subsequent washing with water. The aluminum plate was then subjected to an electrolytic surface-roughening treatment in a 1.5% aqueous nitric acid solution, at the quantity of electricity at the anode time of 270 coulomb/dm$^2$, using a sinusoidal alternating waved current under the condition of $V_A$=12.7 V. At this stage, the surface roughness of the resulting aluminum plate was determined and it was found to be 0.30 μm (as expressed in terms of Ra). Subsequently, the plate was immersed in a 30% aqueous solution of sulfuric acid to thus carry out the desmutting thereof at 40° C. for 2 minutes and then anodized at a current density of 5 A/dm$^2$, at 33° C. for 50 seconds in a 20% aqueous solution of sulfuric acid while a cathode was positioned on the grained surface of the plate, and as a result, the thickness of the anodized layer was found to be 2.7 g/m$^2$.

A coating solution for forming an intermediate layer having the following composition was applied onto the aluminum plate thus treated such that the amount of the solution weighed after drying was equal to 2 mg/m$^2$ and then dried at 100° C. for 3 minutes.

Coating Liquid for Forming Intermediate Layer

The following components were stirred and mixed together in amounts specified below. After about 5 minutes, there was observed generation of heat. The components were reacted for 60 minutes and then 20,000 g of methanol was added to thus give a coating liquid for forming an intermediate layer:

| | |
|---|---|
| Methanol | 100 g |
| DDP-8 (Phosphate compound available from Nikko Chemicals, inc.) | 15 g |
| Water | 10 g |
| Phosphoric acid | 5 g |
| Tetra-ethoxy silane | 50 g |
| 3-Methacryloxy-propyl tri-ethoxy silane | 50 g |

The following highly sensitive photopolymerizable composition 5 having the composition specified below was applied onto the undercoating layer in such a manner that the coated amount thereof weighed after drying was equal to 1.5 g/m$^2$ and then dried at 100° C. for 90 seconds to thus form an image-recording layer.

| Photopolymerizable Composition 5 | |
|---|---|
| Ethylenically unsaturated bond-containing compound (A1) | 1.8 g |
| Binder polymer (B1) | 1.5 g |
| Sensitizing dyestuff (C1) | 0.15 g |
| Photopolymerization initiator (D1) | 0.2 g |
| β-Phthalocyanine (F1) dispersion | 0.2 g |
| Fluorine atom-containing surfactant; Megafac F177 (available from DIC*) | 0.03 g |
| Methyl ethyl ketone | 10 g |
| Propylene glycol monomethyl ether acetate | 10 g |

*Dainippon Ink and Chemicals, Inc.

Photopolymerizable Composition 5

A1

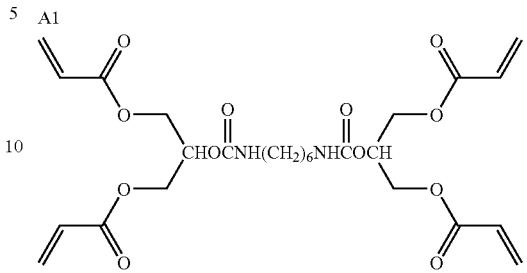

B1

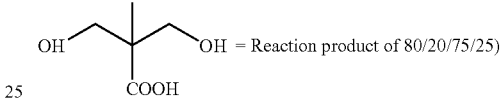

OH = Reaction product of 80/20/75/25)

C1

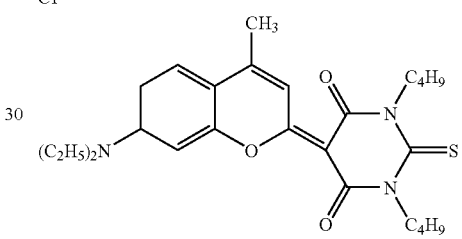

D1

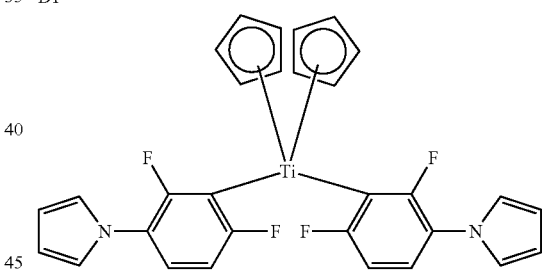

F1

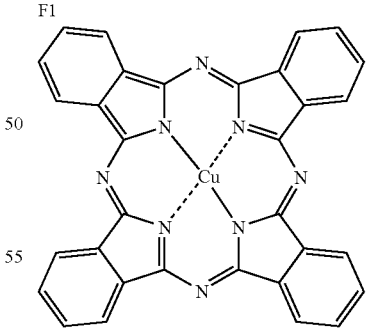

A 3% by weight aqueous solution of polyvinyl alcohol (degree of saponification: 98 mole %; degree of polymerization: 500) was applied onto the photopolymerizable image-recording layer thus formed such that the coated amount of the aqueous solution was 2.5 g/m$^2$ as expressed in terms of the amount determined after drying and then dried at 100° C. for 90 seconds to thus form an original plate (5) for preparing a lithographic printing plate.

[Original Plate (6) for Preparing Lithographic Printing Plate]

The same procedures used for preparing the original plate (5) for forming a lithographic printing plate were repeated except for using a photopolymerizable composition 6 which was identical to the photopolymerizable composition 6 except that C-2 (specified later) was substituted for C-1 used in the composition 6, to thus prepare an original plate (6) for preparing a lithographic printing plate.

[Original Plate (7) for Preparing Lithographic Printing Plate]

The same procedures used for preparing the original plate (6) for forming a lithographic printing plate were repeated except for using a photopolymerizable composition 7 which was identical to the photopolymerizable composition 6 except that 0.1 g of a triazine compound (I)-1 was further added to the composition 6, to thus prepare an original plate (7) for preparing a lithographic printing plate.

[Original Plate (8) for Preparing Lithographic Printing Plate]

A 1S aluminum plate having a thickness of 0.30 mm was surface-grained using a No. 8 nylon brush and an aqueous suspension of 800 mesh pumice stone and then sufficiently washed with water. The aluminum plate was then immersed in a 10% sodium hydroxide solution at 70° C. for 60 seconds for etching, followed by washing with running water, neutralization and washing with a 20% nitric acid solution and subsequent washing with water. The aluminum plate was then subjected to an electrolytic surface-roughening treatment in a 1% aqueous nitric acid solution, at the quantity of electricity at the anode time of 300 coulomb/dm$^2$, using a sinusoidal alternating waved current under the condition of $V_A$=12.7 V. At this stage, the surface roughness of the resulting aluminum plate was determined and it was found to be 0.45 μm (as expressed in terms of Ra). Subsequently, the plate was immersed in a 30% aqueous solution of sulfuric acid to thus carry out the desmutting thereof at 55° C. for 2 minutes and then anodized at a current density of 5 A/dm$^2$ and at 33° C. for 50 seconds in a 20% aqueous solution of sulfuric acid while a cathode was positioned on the grained surface of the plate and as a result, the thickness of the anodized layer was found to be 2.7 g/m$^2$.

A liquid containing a methyl methacrylate/ethyl acrylate/sodium 2-acrylamido-2-methyl-propane sulfonate copolymer (molar ratio: 60/25/15; molecular weight Mn=30,000) dissolved in water/methanol (5 g/95 g) mixed solvent was coated on the surface of the aluminum plate on which the foregoing anodized layer had been formed in such a manner that the amount of the liquid determined after drying was equal to 3 mg/m$^2$ and then dried at 80° C. for 30 seconds to thus form an intermediate layer and the resulting aluminum plate was used as an aluminum substrate.

The following highly sensitive photopolymerizable composition 8 having the composition specified below was applied onto the intermediate layer in such a manner that the coated amount thereof weighed after drying was equal to 1.5 g/m$^2$ and then dried at 100° C. for 90 seconds to thus form a image-recording layer.

| Photopolymerizable Composition 8 | |
|---|---|
| Ethylenically unsaturated bond-containing compound (A2) | 1.5 g |
| Binder polymer (B2) | 1.8 g |
| Sensitizing dyestuff (C2) | 0.1 g |
| The foregoing photopolymerization initiator (D1) | 0.2 g |
| β-Phthalocyanine (F1) dispersion | 0.2 g |
| Fluorine atom-containing surfactant; Megafac F177 (available from DIC*) | 0.03 g |

| Photopolymerizable Composition 8 | |
|---|---|
| Methyl ethyl ketone | 10 g |
| Propylene glycol monomethyl ether acetate | 10 g |

*Dainippon Ink and Chemicals, Inc.

(A-2)

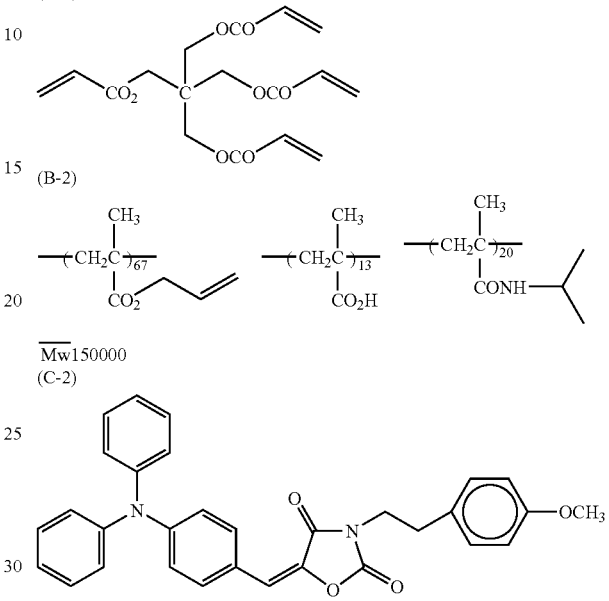

Mw150000

(C-2)

A 3% by weight aqueous solution of polyvinyl alcohol (degree of saponification: 98 mole %; degree of polymerization: 500) was applied onto the photopolymerizable image-recording layer thus formed such that the coated amount of the aqueous solution was 2.5 g/m$^2$ as expressed in terms of the amount determined after drying and then dried at 100° C. for 90 seconds to thus form an original plate (8) for preparing a lithographic printing plate.

Among these original plates for preparing lithographic printing plates, the original plate (5) obtained using the photopolymerizable composition 5 was imagewise exposed to light emitted from an FD•YAG laser (Plate Jet 4 available from CSI Company) and the original plates (6) to (8) obtained using the photopolymerizable compositions 6 to 8 respectively were imagewise exposed to light emitted from a violet laser (Luxel Vx9600CTP available from Fuji Photo Film Co., Ltd.) under the conditions of 175 lines/in at 2400 dpi, while variously changing the exposure value.

The imagewise exposed original plates were then subjected to a standard treatment in an automatic developing machine (LP-850PII available from Fuji Photo Film Co., Ltd.) which comprised a developer having the composition specified below and a finishing gum liquid FP-2W (available from Fuji Photo Film Co., Ltd.).

Developer

The following ingredients were dissolved in water to thus prepare a developer:

| Carbonate | a mole/L |
|---|---|
| Hydrogen carbonate | b mole/L |
| Surfactant | c g/L |
| Additives | d g/L |
| Ethylenediamine-tetraacetic acid.4 Na salt (Chelating agent) | 2 g/L |

TABLE 6

| Developer No. | Alkaline agent 1, (mole/L) | Alkaline agent 2, (mole/L) | Alkaline agent 3, (mole/L) |
|---|---|---|---|
| 21 | $K_2CO_3$ (0.17) | $KHCO_3$ (0.038) | Not added |
| 22 | $K_2CO_3$ (0.3) | $KHCO_3$ (0.067) | Not added |
| 23 | $K_2CO_3$ (0.59) | $KHCO_3$ (0.13) | Not added |
| 24 | $Na_2CO_3$ (0.4) | $NaHCO_3$ (0.09) | Not added |
| 25 | $K_2CO_3$ (0.3) | $KHCO_3$ (0.067) | Not added |
| 26 | $K_2CO_3$ (0.3) | $KHCO_3$ (0.067) | Not added |
| 27 | $K_2CO_3$ (0.13) | $KHCO_3$ (0.029) | Not added |
| 28 | $K_2CO_3$ (0.13) | $KHCO_3$ (0.029) | Not added |
| 29 | $K_2CO_3$ (0.3) | $KHCO_3$ (0.067) | Not added |
| 30 | $K_2CO_3$ (0.3) | $KHCO_3$ (0.067) | Not added |
| 31 | $K_2CO_3$ (0.3) | $KHCO_3$ (0.067) | KOH (0.015) |
| 32 | $K_2CO_3$ (0.11) | $KHCO_3$ (0.13) | Not added |
| 33 | $K_2CO_3$ (0.08) | $KHCO_3$ (0.25) | Not added |
| 34* | $K_2CO_3$ (0.13) | $KHCO_3$ (0.029) | |
| 35* | $K_2CO_3$ (0.65) | $KHCO_3$ (0.145) | |
| 36* | $K_2CO_3$ (0.3) | $KHCO_3$ (0.067) | |
| 37* | $K_2CO_3$ (0.3) | $KHCO_3$ (0.067) | |
| 38* | KOH (0.1) | Not added | |
| 39* | KOH (0.0001) | Not added | |

| Developer No. | Surfactant, (wt %) | Additive, (g/L) | pH at 25° C. | Conductivity at 25° C., (mS) |
|---|---|---|---|---|
| 21 | II-13 (5) | Not added | 10.4 | 34.2 |
| 22 | II-13 (5) | Not added | 10.4 | 55.2 |
| 23 | II-13 (5) | Not added | 10.4 | 98.5 |
| 24 | II-13 (5) | Not added | 10.4 | 58.4 |
| 25 | II-13 (2) | Not added | 10.4 | 55.1 |
| 26 | II-13 (8) | Not added | 10.4 | 55.6 |
| 27 | II-13 (5) | Potassium citrate (12) | 10.4 | 34.7 |
| 28 | II-13 (5) | Sodium chloride (7) | 10.4 | 37.3 |
| 29 | II-22 (5) | Not added | 10.4 | 34.6 |
| 30 | I-23 (5) | Not added | 10.4 | 34.5 |
| 31 | II-13 (5) | Not added | 11.4 | 60.2 |
| 32 | II-13 (5) | Not added | 9.8 | 49.3 |
| 33 | II-13 (5) | Not added | 9.1 | 42.2 |
| 34* | II-13 (5) | Not added | 10.4 | 28.4 |
| 35* | II-13 (5) | Not added | 10.4 | 108.1 |
| 36* | II-13 (0.5) | Not added | 10.4 | 55.2 |
| 37* | II-13 (11) | Not added | 10.4 | 55.2 |
| 38* | II-13 (5) | Not added | 13 | 35.1 |
| 39* | II-13 (5) | Not added | 10.4 | 6.6 |

*Comparative developer.

[Evaluation]

As an indication of the developing ability evaluation, each imagewise exposed original plate was inspected for the speed (rate) of development of the non-image area with an alkaline developer and further it was likewise inspected for the rate of penetration of each alkaline developer into the image-recording layer as an indication of the printing durability of the resulting printing plate.

The following are the details of the methods for determining "the rate of development of non-image areas with an alkaline developer" and "the rate of penetration of each alkaline developer into the image-recording layer", used in the present invention.

Determination of Rate of Development of Non-Image Area with Alkaline Developer

The term "the rate of development of non-image areas with an alkaline developer" herein used means the value obtained by dividing the thickness (m) of the image-recording layer (non-image area) by the time (sec) required for developing (or removing) the same.

The method for determining the developing speed used in the present invention comprises, as shown in FIG. 1, immersing a material which comprises an aluminum substrate provided thereon with an un-exposed image-recording layer in an alkaline developer (30° C.) whose physical properties fall within the predetermined ranges, and then examining the dissolution behavior of the image-recording layer using a DRM interference wave (fringe)-measuring device. FIG. 1 is a schematic diagram showing such a DRM interference wave-measuring device for determining the dissolution behavior of the image-recording layer. In the present invention, any film thickness change was detected through the interference using light rays of 640 nm. In case where the development of the layer is one started from the surface of the image-recording layer without being accompanied by any swelling, the film thickness is gradually reduced with the elapse of time to thus provide interference fringes in proportion to the thickness of the image-recording layer. In case of the dissolution accompanied by swelling, the film thickness may vary by the penetration of a developer into the layer and therefore, any distinct interference fringe cannot be obtained.

The measurement was continued under such conditions to thus determine the time (s) (the time required for complete development) required for completely removing the image-recording layer and for making the film thickness zero and the developing speed (rate of development) can be calculated from the time (s) and the film thickness (μm) of the image-recording layer according to the following equation. The results obtained are judged as follows: The higher the rate of development, the easier the removal of the film with the developer and the higher the developing ability of the developer.

Developing Speed (of Un-Exposed Area)=[Thickness of Image-Recording Layer (μm)]/[Time (sec) Required for Complete Development]

To ensure the correspondence to the actual performance, the resulting printing plate was subjected to a test for examining the developing ability (see the section concerning "Evaluation of Developing Ability" given later).

Determination of "Rate of Penetration of Alkaline Developer into Image-Recording Layer"

In addition, the term "the rate of penetration of an alkaline developer into the image-recording layer" herein used means a value indicating the rate of variation of the electrostatic capacity (F) observed when immersing, in a developer, a material obtained by applying the foregoing image-recording layer onto a conductive substrate.

As shown in FIG. 2, the method for determining the electrostatic capacity (F) as a criterion for the permeability in the present invention comprises, for instance, immersing, in an alkaline developer (28° C.), an aluminum substrate serving as an electrode and provided thereon with an image-recording layer which has been exposed (in case of the photopolymerizable composition 5, the layer is exposed at an exposure value of 0.25 mJ/cm² using an FD•YAG laser (Plate Jet 4 available from CSI Company); and in case of the photopolymerizable compositions 6 and 7, the layer is exposed at an exposure value of 0.05 mJ/cm² using a violet laser (Luxel Vx9600CTP available from Fuji Photo Film Co., Ltd.) and then cured, connecting the aluminum substrate to a leading wire, while using a usual electrode as an opposite electrode and then applying an electric voltage between these electrodes. After the application of an electric voltage, the developer penetrates into the image-recording layer with the lapse of immersion time and finally arrives at the interface between the recording layer and the substrate to thus cause a change in the electrostatic capacity.

Accordingly, the rate of penetration of an alkaline developer into the image-recording layer can be calculated from the time (s) required till the electrostatic capacity undergo a change and the film thickness (μm) of the image-recording layer according to the following equation. In this respect, the results obtained are judged as follows: The smaller the rate of the developer penetration, the lower the permeability of the developer into the image-recording layer.

Rate of Developer Penetration (of Exposed Area)= [film thickness (μm) of the image-recording layer]/[Time (s) required till electrostatic capacity arrives at a constant level]

To ensure the correspondence to the actual performance, the resulting printing plate was set on a printing press so that the printing plate was inspected for the printing durability (see the section concerning "Evaluation of Printing Durability" given later).

In respect of physical properties of the original plate for preparing a lithographic printing plate according to the present invention, the rate of development of the un-exposed area with an alkaline developer is preferably not less than 80 nm/sec, more preferably 80 to 400 nm/sec and further preferably 90 to 200 nm/sec. Moreover, the rate of penetration of an alkaline developer into the exposed area is preferably not more than 100 nF/sec, more preferably not more than 90 nF/sec and further preferably not more than 80 nF/sec.

(Evaluation of Developing Ability)

The actual developing ability of the non-image area was examined by developing the imagewise exposed image-forming material with a developer specified in the foregoing Table 6 at 28° C. for 18 seconds using LP-850PII available from Fuji Photo Film Co., Ltd.

(Evaluation of Printing Durability)

The original plates (5) to (7) for preparing lithographic printing plates were imagewise exposed to light emitted from an FD•YAG laser (Plate Jet 4 available from CSI Company) under the conditions of 175 lines/in at 2400 dpi and an exposure value of 0.25 mJ/cm$^2$, in case of the original plates obtained using the photopolymerizable composition 5 and to light emitted from a violet laser (Luxel Vx9600CTP available from Fuji Photo Film Co., Ltd.) under the conditions of 175 lines/in at 2400 dpi and an exposure value of 0.05 mJ/cm$^2$, in case of the original plates obtained using the photopolymerizable compositions 6 and 7, respectively. After the imagewise exposure, the imagewise exposed original plates were washed with tap water to thus remove the protective layers and then developed using LP-850PII available from Fuji Photo Film Co., Ltd. at 28° C. for 18 seconds. In this respect, the finisher used herein was a 1:1 water/FP-2W (available from Fuji Photo Film Co., Ltd.).

Each of the resulting lithographic printing plates was set on a printing press LISRON available from KOMORI Corporation (K.K.) to thus determine the number of acceptable printed matters which was used as the indication for the printing durability.

(pH Reduction Due to Carbon Dioxide Gas Present in the Air)

Each developer was charged in the automatic developing machine: LP-850PII available from Fuji Photo Film Co., Ltd. and the developer was inspected for the pH change observed when allowing it to stand over one day without processing any original plate.

(Generation of Scum)

After developing 20 m$^2$ of the foregoing coated light-sensitive material in the foregoing developer (one liter), the developer was allowed to stand over one month and it was inspected for the generation of precipitated scum. The results obtained are likewise listed in the following Tables 7 to 10.

TABLE 7

Original Plate (5) for Lithographic Printing Plate

| Dev. No. | Rate of dev. of non-image area (μm/sec) | Ability of dev. | Rate of penetr. into image area (nF/sec) | Printing durability (×10$^4$) | pH Change (24 hrs.) | Scum |
|---|---|---|---|---|---|---|
| 21 | 120 | ○ | 40 | 16 | 0.1 | ○ |
| 22 | 145 | ○ | 45 | 16 | 0.1 | ○ |
| 23 | 150 | ○ | 60 | 15 | 0.1 | ○ |
| 24 | 145 | ○ | 60 | 16 | 0.1 | ○ |
| 25 | 100 | ○ | 35 | 17 | 0.1 | Δ |
| 26 | 145 | ○ | 60 | 15 | 0.1 | ○ |
| 27 | 120 | ○ | 45 | 16 | 0.1 | ○ |
| 28 | 120 | ○ | 50 | 16 | 0.1 | ○ |
| 29 | 135 | ○ | 50 | 16 | 0.1 | ○ |
| 30 | 95 | ○ | 55 | 16 | 0.1 | Δ |
| 31 | 150 | ○ | 75 | 15 | 0.15 | ○ |
| 32 | 110 | ○ | 45 | 16 | 0.1 | ○ |
| 33 | 95 | ○ | 45 | 16 | 0.1 | ○ |
| 34* | 80 | Remaining film | 35 | 16 | 0.1 | ○ |
| 35* | 75 | Remaining film | 35 | 16 | 0.1 | ○ |
| 36* | 25 | Remaining film | 30 | 17 | 0.1 | X |
| 37* | 145 | ○ | 120 | 13 | 0.1 | X |
| 38* | 150 | ○ | 170 | 13 | 0.4 | ○ |
| 39* | 10 | Remaining film | 35 | 17 | 0.6 | X |

*Comparative developer.

TABLE 8

Original Plate (6) for Lithographic Printing Plate

| Dev. No. | Rate of dev. of non-image area (μm/sec) | Ability of dev. | Rate of penetr. into image area (nF/sec) | Printing durability (×10$^4$) | pH Change (24 hrs.) | Scum |
|---|---|---|---|---|---|---|
| 21 | 125 | ○ | 35 | 17 | 0.1 | ○ |
| 22 | 145 | ○ | 40 | 16 | 0.1 | ○ |
| 23 | 155 | ○ | 60 | 16 | 0.1 | ○ |
| 24 | 145 | ○ | 55 | 16 | 0.1 | ○ |
| 25 | 105 | ○ | 30 | 17 | 0.1 | Δ |
| 26 | 150 | ○ | 60 | 15 | 0.1 | ○ |
| 27 | 125 | ○ | 40 | 16 | 0.1 | ○ |
| 28 | 120 | ○ | 45 | 17 | 0.1 | ○ |
| 29 | 130 | ○ | 50 | 16 | 0.1 | ○ |
| 30 | 100 | ○ | 50 | 16 | 0.1 | Δ |
| 31 | 155 | ○ | 70 | 15 | 0.15 | ○ |
| 32 | 115 | ○ | 45 | 17 | 0.1 | ○ |
| 33 | 100 | ○ | 40 | 16 | 0.1 | ○ |
| 34* | 85 | Remaining film | 30 | 16 | 0.1 | ○ |
| 35* | 70 | Remaining film | 30 | 16 | 0.1 | ○ |
| 36* | 30 | Remaining film | 30 | 18 | 0.1 | X |
| 37* | 140 | ○ | 115 | 13 | 0.1 | X |
| 38* | 155 | ○ | 170 | 13 | 0.4 | ○ |
| 39* | 15 | Remaining film | 30 | 17 | 0.6 | X |

*Comparative developer.

TABLE 9

Original Plate (7) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 21 | 125 | ◯ | 35 | 17 | 0.1 | ◯ |
| 22 | 145 | ◯ | 40 | 16 | 0.1 | ◯ |
| 23 | 155 | ◯ | 60 | 16 | 0.1 | ◯ |
| 24 | 145 | ◯ | 55 | 16 | 0.1 | ◯ |
| 25 | 105 | ◯ | 30 | 17 | 0.1 | △ |
| 26 | 150 | ◯ | 60 | 15 | 0.1 | ◯ |
| 27 | 125 | ◯ | 40 | 16 | 0.1 | ◯ |
| 28 | 120 | ◯ | 45 | 17 | 0.1 | ◯ |
| 29 | 130 | ◯ | 50 | 16 | 0.1 | ◯ |
| 30 | 100 | ◯ | 50 | 16 | 0.1 | △ |
| 31 | 155 | ◯ | 70 | 15 | 0.15 | ◯ |
| 32 | 115 | ◯ | 45 | 17 | 0.1 | ◯ |
| 33 | 100 | ◯ | 40 | 16 | 0.1 | ◯ |
| 34* | 85 | Remaining film | 30 | 16 | 0.1 | ◯ |
| 35* | 70 | Remaining film | 30 | 16 | 0.1 | ◯ |
| 36* | 30 | Remaining film | 30 | 18 | 0.1 | X |
| 37* | 140 | ◯ | 115 | 13 | 0.1 | X |
| 38* | 155 | ◯ | 170 | 13 | 0.4 | ◯ |
| 39* | 15 | Remaining film | 30 | 17 | 0.6 | X |

*Comparative developer.

TABLE 10

Original Plate (8) for Lithographic Printing Plate

| Dev. No. | Rate of dev. of non-image area (μm/sec) | Ability of dev. | Rate of penetr. into image area (nF/sec) | Printing durability (×10⁴) | pH Change (24 hrs.) | Scum |
|---|---|---|---|---|---|---|
| 21 | 115 | ◯ | 45 | 13 | 0.1 | ◯ |
| 22 | 140 | ◯ | 45 | 13 | 0.1 | ◯ |
| 23 | 150 | ◯ | 65 | 12 | 0.1 | ◯ |
| 24 | 140 | ◯ | 65 | 13 | 0.1 | ◯ |
| 25 | 100 | ◯ | 35 | 14 | 0.1 | △ |
| 26 | 145 | ◯ | 65 | 12 | 0.1 | ◯ |
| 27 | 120 | ◯ | 50 | 13 | 0.1 | ◯ |
| 28 | 115 | ◯ | 55 | 13 | 0.1 | ◯ |
| 29 | 135 | ◯ | 55 | 13 | 0.1 | ◯ |
| 30 | 95 | ◯ | 60 | 13 | 0.1 | △ |
| 31 | 145 | ◯ | 75 | 12 | 0.15 | ◯ |
| 32 | 110 | ◯ | 50 | 13 | 0.1 | ◯ |
| 33 | 90 | ◯ | 50 | 13 | 0.1 | ◯ |
| 34* | 80 | Remaining film | 40 | 13 | 0.1 | ◯ |
| 35* | 75 | Remaining film | 40 | 13 | 0.1 | ◯ |
| 36* | 25 | Remaining film | 35 | 14 | 0.1 | X |
| 37* | 145 | ◯ | 125 | 10 | 0.1 | X |
| 38* | 150 | ◯ | 175 | 10 | 0.4 | ◯ |
| 39* | 10 | Remaining film | 40 | 14 | 0.6 | X |

*Comparative developer.

In the foregoing Tables 7 to 10, the open circle in the column entitled: "Ability of dev. (ability of development)" means that there is not observed any remaining film; the same symbol appearing in the column entitled: "Scum" (generation of scum) means that there is not observed any precipitate in the developer, the open triangle means that there is observed a trace amount of precipitates in the developer and the symbol: x means that there is observed the generation of a large amount of precipitates in the developer.

The results listed in the foregoing Tables 7 to 10 clearly indicate that the image-forming method of the present invention permits the achievement of a sufficient developing ability even at a relatively low pH (8.5 to 11.5) at which the image-forming material is not damaged so much and the preparation of a printing plate having good printing durability. Moreover, the developer undergoes only a slight change in pH and therefore, the developer would cause only a slight reduction in the developing activity due to the action of carbon dioxide gas. Further, there is observed almost no trouble due to the generation of scum (the developers 21 to 33 listed in Tables 7 to 10). On the other hand, when images were formed according to the method other than that of the present invention, there were observed various problems such that any sufficient developing ability cannot be ensured because of the presence of remaining films, that the resulting printing plate had low or insufficient printing durability and that scum generated during the development undergoes precipitation in the developing bath (the comparative developers 34 to 39 listed in Tables 7 to 10).

What is claimed is:

1. A method for forming images comprising the steps of imagewise exposing a photopolymerizable image-forming material comprising a substrate provided thereon with an image-recording layer which comprises a photopolymerization initiator system sensitive to light rays whose wavelength falls within the visible to ultraviolet ranges, a polymerizable compound carrying at least one ethylenically unsaturated group and a binder polymer and then developing the imagewise exposed image-forming material with a developer containing at least one carbonate and at least one hydrogen carbonate, containing at least one surfactant selected from the group consisting of anionic surfactants and nonionic aromatic ether type surfactants represented by the following general formula (1) in an amount ranging from 1.0 to 10% by weight on the basis of the total weight of the developer, and having a pH value ranging from 8.5 to 11.5 and an electrical conductivity x falling within a predetermined range: $30 < x < 100$ mS/cm:

$$X—Y—O-(A)_n-(B)_m—H \quad (1)$$

wherein, X represents a substituted or unsubstituted aromatic group, Y represents a single bond or an alkylene group having 1 to 10 carbon atoms, A and B may be the same or different from one another and represent either —$CH_2CH_2O$— or —$CH_2CH(CH_3)O$—, and each of n and m represents 0 or an integer ranging from 1 to 100, provided that n and m do not simultaneously represent 0 and that if either n or m represents 0, n and m are not 1.

2. The image-forming method of claim 1, wherein the anionic surfactant is a compound having at least one anionic group derived from sulfonic acid or anionic group derived from sulfuric acid monoester.

3. The image-forming method of claim 2, wherein the anionic surfactant is a compound having at least one anionic group derived from sulfonic acid or anionic group derived from sulfuric acid monoester, and further having at least one substituted or unsubstituted aromatic group.

4. The image-forming method of claim 1, wherein the nonionic aromatic ether type surfactants are represented by the following general formulas (1-A) and (1-B):

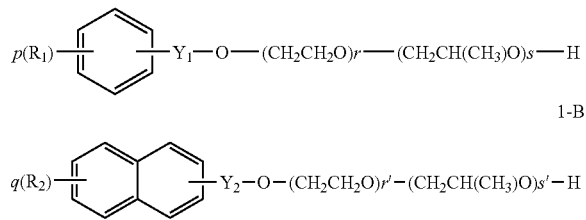

wherein, each of $R_1$ and $R_2$ represents a hydrogen atom or an organic group having 1 to 100 carbon atoms; each of p and q represents 1 or 2; each of $Y_1$ and $Y_2$ represents a single bond or an alkylene group having 1 to 10 carbon atoms; each of r and s represents 0 or an integer ranging from 1 to 100, provided that r and s do not simultaneously represent 0 and that if either r or s represents 0, r and s are not 1; and each of r' and s' represents 0 or an integer falling within the range of from 1 to 100, provided that r' and s' do not simultaneously represent 0 and that if either r' or s' represents 0, r' and s' are not 1.

5. The image-forming method of claim 1, wherein the carbonate is at least one member selected from the group consisting of carbonates of inorganic alkalis and the hydrogen carbonate is at least one member selected from the group consisting of hydrogen carbonates of inorganic alkalis.

6. The image-forming method of claim 1, wherein the carbonate is at least one member selected from the group consisting of potassium carbonate, sodium carbonate and ammonium carbonate; and the hydrogen carbonate is at least one member selected from the group consisting of potassium hydrogen carbonate, sodium hydrogen carbonate and ammonium hydrogen carbonate.

7. The image-forming method of claim 1, wherein the developer further comprises at least one compound selected from the group consisting of alkali metal salts of organic acids and alkali metal salts of inorganic acids.

8. The image-forming method of claim 1, wherein the photopolymerization initiator system sensitive to light rays having a wavelength falling within the visible to ultraviolet ranges comprises a sensitizing dyestuff whose maximum absorption wavelength falls within the range of from 330 to 700 nm and a photopolymerization initiator.

9. The image-forming method of claim 8, wherein the photopolymerization initiator system comprises a titanocene compound.

10. The image-forming method of claim 9, wherein the photopolymerization initiator system comprises a titanocene compound and a triazine compound.

* * * * *